United States Patent
Oka

(10) Patent No.: US 11,862,438 B2
(45) Date of Patent: *Jan. 2, 2024

(54) PLASMA PROCESSING APPARATUS, CALCULATION METHOD, AND CALCULATION PROGRAM

(71) Applicant: TOKYO ELECTRON LIMITED, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/958,962

(22) Filed: Oct. 3, 2022

(65) Prior Publication Data
US 2023/0023700 A1    Jan. 26, 2023

Related U.S. Application Data

(63) Continuation of application No. 16/698,079, filed on Nov. 27, 2019, now Pat. No. 11,488,808.

(30) Foreign Application Priority Data

Nov. 30, 2018  (JP) ................................. 2018-224397
May 29, 2019  (JP) ................................. 2019-100516

(51) Int. Cl.
*H01J 37/32* (2006.01)
*H01L 21/67* (2006.01)

(52) U.S. Cl.
CPC .. *H01J 37/32642* (2013.01); *H01J 37/32449* (2013.01); *H01J 37/32669* (2013.01);
(Continued)

(58) Field of Classification Search
CPC .......... H01J 37/32642; H01J 37/32449; H01J 37/32669; H01J 37/32724;
(Continued)

(56) References Cited

U.S. PATENT DOCUMENTS 11,488,808 B2 * 11/2022 Oka ................... H01J 37/32642
2009/0026170 A1 * 1/2009 Tanaka .............. H01J 37/32091
216/60

(Continued)

FOREIGN PATENT DOCUMENTS

JP       2015-201558 A     11/2015

*Primary Examiner* — Charlee J. C. Bennett
(74) *Attorney, Agent, or Firm* — XSENSUS LLP

(57) ABSTRACT

In a plasma processing apparatus, a mounting table includes a heater for adjusting a temperature of a mounting surface mounting thereon a consumable part consumed by plasma processing. A heater control unit controls a supply power to the heater such that the heater reaches a setting temperature. A measurement unit measures, while controlling the supply power to the heater such that the temperature of the heater becomes constant, the supply powers in a non-ignition state where plasma is not ignited and in a transient state where the supply power is decreased after the plasma is ignited. A parameter calculation unit calculates a thickness of the consumable part by performing fitting with a calculation model, which has the thickness of the consumable part as a parameter and calculates the supply power in the transient state, by using the measured supply powers in the non-ignition state and in the transient state.

19 Claims, 19 Drawing Sheets

(52) U.S. Cl.
CPC .. *H01J 37/32724* (2013.01); *H01J 37/32926* (2013.01); *H01L 21/67248* (2013.01); *H01L 21/67253* (2013.01); *H01J 2237/3321* (2013.01)

(58) Field of Classification Search
CPC ........ H01J 37/32926; H01J 2237/3321; H01L 21/67248; H01L 21/67253
USPC .................. 118/715–733; 156/345.1–345.55
See application file for complete search history.

(56) References Cited

U.S. PATENT DOCUMENTS

| | | | |
|---|---|---|---|
| 2013/0228323 A1* | 9/2013 | Makabe | F28F 27/02 165/59 |
| 2018/0211853 A1* | 7/2018 | Oka | H01L 21/67253 |
| 2018/0350566 A1* | 12/2018 | Tobe | H01J 37/32642 |
| 2019/0108986 A1* | 4/2019 | Saitoh | H01L 21/6833 |
| 2019/0148120 A1* | 5/2019 | Oka | H01J 37/32935 219/468.1 |
| 2019/0318918 A1* | 10/2019 | Saitoh | H01J 37/32669 |
| 2020/0111650 A1* | 4/2020 | Oka | H01L 21/67103 |
| 2020/0365427 A1* | 11/2020 | Oka | H01J 37/32724 |
| 2020/0367320 A1* | 11/2020 | Oka | H01L 21/67011 |
| 2021/0020418 A1* | 1/2021 | Hayashi | H01J 37/32926 |

\* cited by examiner

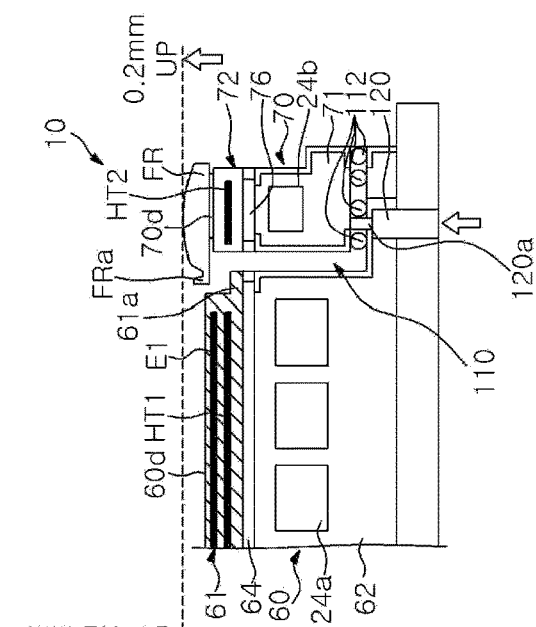
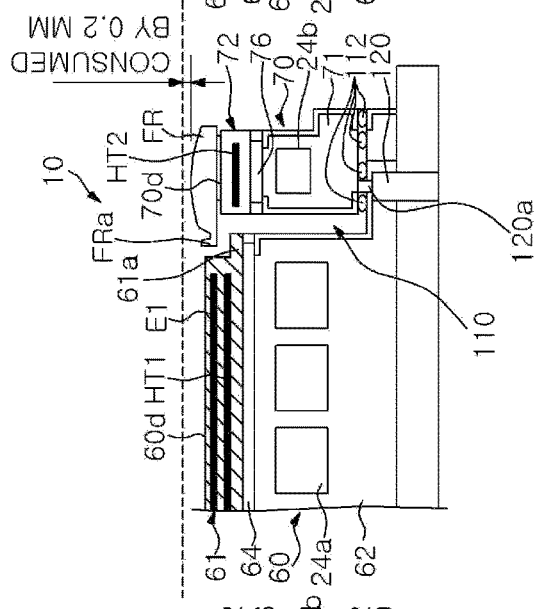
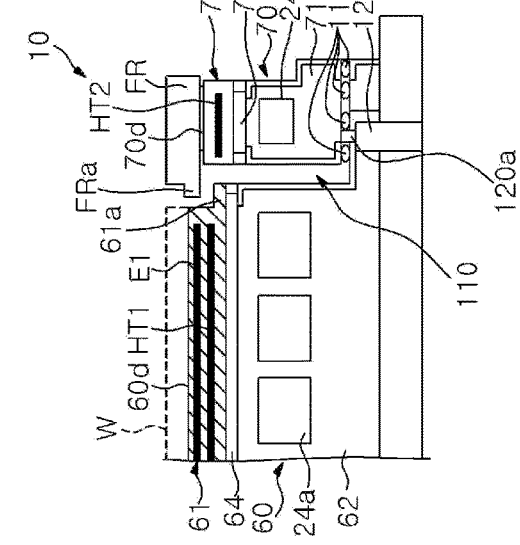

PLASMA PROCESSING APPARATUS, CALCULATION METHOD, AND CALCULATION PROGRAM

CROSS-REFERENCE TO RELATED APPLICATIONS

This application is a continuation application of U.S. application Ser. No. 16/698,079 filed Nov. 27, 2019, which claims priority to Japanese Patent Application Nos. 2018-224397 filed Nov. 30, 2018 and 2019-100516 filed May 29, 2019, the entire contents of which are incorporated herein by reference and priority is claimed to each.

TECHNICAL FIELD

The present disclosure relates to a plasma processing apparatus, a calculation method, and a calculation program.

BACKGROUND

Japanese Patent Application Publication No. 2015-201558 proposes a technique for flattening an interface of a plasma sheath formed above a semiconductor wafer and an interface of a plasma sheath formed above a focus ring by disposing an annular coil at an upper portion of a chamber and generating a magnetic field by supplying a current to the coil.

SUMMARY

The present disclosure provides a technique capable of obtaining the degree of consumption of a consumable part.

In accordance with an aspect of the present disclosure, there is provided a plasma processing apparatus including: a mounting table including a heater configured to adjust a temperature of a mounting surface thereof on which a consumable part that is consumed by plasma processing is mounted; a heater control unit configured to control a supply power to the heater such that the heater reaches a setting temperature; a measurement unit configured to measure, while the supply power to the heater is controlled by the heater control unit such that the temperature of the heater becomes constant, the supply power in a non-ignition state in which plasma is not ignited and the supply power in a transient state in which the supply power to the heater is decreased after the plasma is ignited, a parameter calculation unit configured to calculate a thickness of the consumable part by performing fitting of the thickness of the consumable part with a calculation model, which has the thickness of the consumable part as a parameter and calculates the supply power in the transient state, by using the measured supply power in the non-ignition state and the measured supply power in the transient state.

BRIEF DESCRIPTION OF THE DRAWINGS

The objects and features of the disclosure will become apparent from the following description of embodiments, given in conjunction with the accompanying drawings, in which:

FIGS. 18A to 18C show an example of a sequence of raising the second mounting table.

DETAILED DESCRIPTION

Hereinafter, embodiments of a plasma processing apparatus, a calculation method, and a calculation program will be described in detail with reference to the drawings. In the present disclosure, for example, an apparatus that performs plasma etching will be described in detail as a specific example of the plasma processing apparatus. Further, the plasma processing apparatus, the calculation method, and the calculation program to be disclosed are not limited by the embodiments.

There is known a plasma processing apparatus for performing an etching process using plasma on a semiconductor wafer (hereinafter, referred to as a "wafer"). In the plasma processing apparatus, a focus ring is arranged to surround the wafer. Since the plasma processing apparatus includes the focus ring disposed to surround the wafer, a plasma state around the wafer becomes uniform so that uniformity of etching characteristics of the entire wafer surface can be obtained. However, the focus ring is consumed and its thickness becomes thinner by etching. In the plasma processing apparatus, the etching characteristics on the outer peripheral portion of the wafer deteriorate as the focus ring is consumed. Therefore, it is necessary to periodically replace the focus ring in the plasma processing apparatus.

Conventionally, in plasma processing apparatus, a replacement time of the focus ring is determined based on past results such as the number of processed wafers, or whether the focus ring should be replaced or not is determined by periodically processing the wafer in which the etching characteristics on the outer peripheral portion of the wafer is monitored.

However, the plasma processing apparatus performs the processings with different process recipes. For this reason, the plasma processing apparatus requires the use of a replacement time that gave a certain amount of margin to the past results and, thus, the productivity of the plasma processing apparatus decreases. Further, the periodic processing of the wafer that is monitored also decreases the productivity of the plasma processing apparatus.

Although the above problems have been described based on the consumption of the focus ring, the same problem occurs for all consumable parts that are consumed by the plasma processing. Therefore, a technique for obtaining the degree of consumption of consumable parts that are consumed by the plasma processing is expected in the plasma processing apparatus.

First Embodiment (Configuration of Plasma Processing Apparatus)

Figure 1:
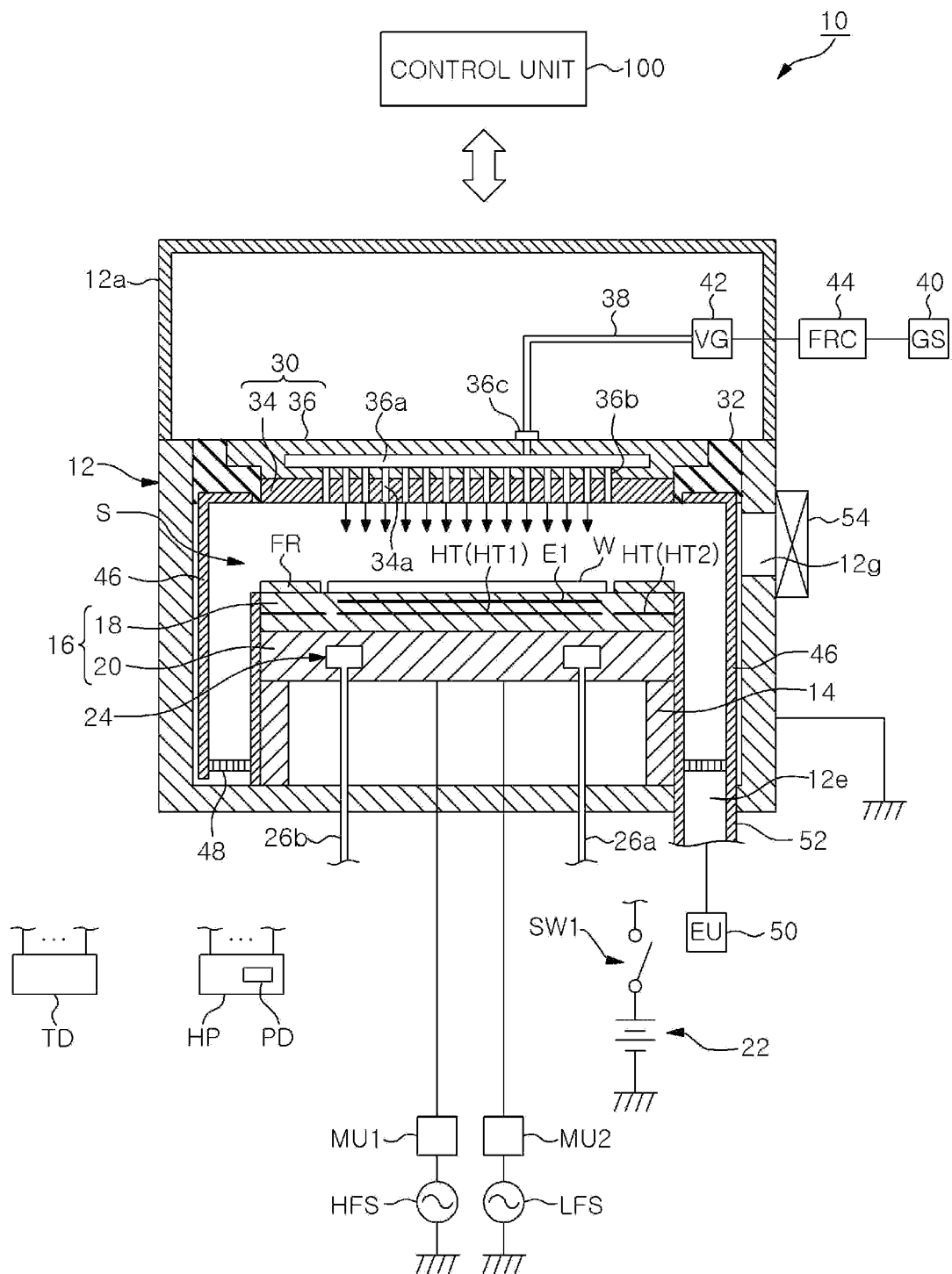
FIG. 1 is a cross-sectional view showing an example of a schematic configuration of a plasma processing apparatus according to a first embodiment.

First, a configuration of a plasma processing apparatus 10 according to a first embodiment will be described. FIG. 1 is a cross-sectional view showing an example of a schematic configuration of the plasma processing apparatus according to the first embodiment. The plasma processing apparatus 10 shown in FIG. 1 is a capacitively-coupled parallel-plate plasma etching apparatus. The plasma processing apparatus 10 includes a substantially cylindrical processing chamber 12. The processing chamber 12 is made of, e.g., aluminum. Further, the processing chamber 12 has an anodically oxidized surface.

A mounting table 16 is provided in the processing chamber 12. The mounting table 16 includes an electrostatic chuck 18 and a base 20. An upper surface of the electrostatic chuck 18 is a mounting surface on which a target object to be subjected to plasma processing is mounted. In the present embodiment, a wafer W that is the target object is mounted on the upper surface of the electrostatic chuck 18. The base 20 has a substantially disc shape, and a main part thereof is made of a conductive metal, e.g., aluminum. The base 20 serves as a lower electrode. The base 20 is supported by a support portion 14. The support portion 14 is a cylindrical member vertically extending upward from a bottom portion of the processing chamber 12.

A first high-frequency power supply HFS is electrically connected to the base 20 through a matching unit MU1. The first high-frequency power supply HFS is a power supply for plasma generation and applies a high-frequency power having a frequency in a range from 27 to 100 MHz, e.g., 40 MHz. Accordingly, plasma is generated directly on the base 20. The matching unit MU1 includes a circuit for matching output impedance of the first high-frequency power supply HFS with input impedance of a load side (base 20 side).

Further, a second high-frequency power supply LFS is electrically connected to the base 20 through the matching unit MU2. The second high-frequency power supply LFS generates and applies a high-frequency power (high-frequency bias power) for attracting ions into the wafer W to the base 20. As a result, a bias potential is generated in the base 20. The high-frequency bias power has a frequency in a range from 400 kHz to 13.56 MHz, e.g., 3 MHz. The matching unit MU2 includes a circuit for matching output impedance of the second high-frequency power supply LFS with input impedance of the load side (base 20 side).

The electrostatic chuck 18 is disposed on the base 20. The wafer W is attracted to and held on the electrostatic chuck 18 by an electrostatic force such as Coulomb force. The electrostatic chuck 18 includes an electrode μl for electrostatic adsorption in a main body portion formed of ceramic. A DC power supply 22 is electrically connected to the electrode μl through a switch SW1. The electrostatic force for attracting and holding the wafer W depends on a value of a DC voltage applied from the DC power supply 22.

On the mounting table 16, a consumable part that is consumed by the plasma processing is mounted. For example, a focus ring FR is disposed as the consumable part to surround the wafer W on the electrostatic chuck 18. The focus ring FR is provided to improve uniformity of plasma processing. The focus ring FR is formed of a material appropriately selected depending on the plasma processing to be performed. For example, the focus ring FR may be formed of silicon or quartz.

A coolant channel 24 is formed in the base 20. The coolant is supplied to the coolant channel 24 from a chiller unit provided outside of the processing chamber 12 through a line 26a. The coolant supplied to the coolant channel 24 returns to the chiller unit through a line 26b.

An upper electrode 30 is provided in the processing chamber 12. The upper electrode 30 is disposed above the mounting table 16 to be opposite to the mounting table 16. The mounting table 16 and the upper electrode 30 are arranged to be substantially parallel to each other.

The upper electrode 30 is supported at an upper portion of the processing chamber 12 via an insulating shielding member 32. The upper electrode 30 includes an electrode plate 34 and an electrode holder 36. The electrode plate 34 faces a processing space S, and a plurality of gas injection holes 34a are formed in the electrode plate 34. The electrode plate 34 is formed of a low resistance conductor or semiconductor with a small Joule heat. The upper electrode 30 is configured to perform a temperature control. For example, the upper electrode 30 includes a temperature control mechanism such as a heater (not shown) to perform the temperature control.

The electrode holder 36 detachably holds the electrode plate 34. The electrode holder 36 is made of a conductive material such as aluminum. A gas diffusion chamber 36a is formed in the electrode holder 36. In the electrode holder 36, a plurality of gas through holes 36b extend downward from the gas diffusion chamber 36a to communicate with the gas injection holes 34a. Further, a gas inlet port 36c through which a processing gas is introduced into the gas diffusion chamber 36a is formed in the electrode holder 36. A gas supply line 38 is connected to the gas inlet port 36c.

A gas source group (GS) 40 is connected to the gas supply line 38 through a valve group (VG) 42 and a flow rate controller group (FRC) 44. The valve group 42 includes a plurality of opening and closing valves. The flow rate controller group 44 includes a plurality of flow rate controllers that are mass flow controllers. Further, the gas source group 40 includes a plurality of gas sources for various kinds of gases required for plasma processing. The gas sources of the gas source group 40 are connected to the gas supply line 38 through the opening and closing valves and the mass flow controllers corresponding thereto.

In the plasma processing apparatus 10, one or more gases from one or more selected gas sources among the gas sources of the gas source group 40 are supplied to the gas supply line 38. Each of one or more gases supplied to the gas supply line 38 is supplied to the gas diffusion chamber 36$a$ and is injected to the processing space S through the gas through holes 36$b$ and the gas injection holes 34$a$.

Further, the plasma processing apparatus 10 further includes a ground conductor 12$a$. The ground conductor 12$a$ is a substantially cylindrical ground conductor and extends upward from the sidewall of the processing chamber 12 so as to be located at a position higher than the height position of the upper electrode 30.

Further, in the plasma processing apparatus 10, the deposition shield 46 is detachably provided along the inner wall of the processing chamber 12. Further, the deposition shield 46 is also provided at an outer periphery of the support portion 14. The deposition shield 46 prevents etching by-products (deposits) from adhering to the processing chamber 12. The deposition shield 46 may be made of aluminum coated with ceramic such as $Y_2O_3$ or the like. The deposition shield 46 is configured to perform a temperature control. For example, the deposition shield 46 includes a temperature control mechanism such as a heater (not shown) to perform the temperature control.

A gas exhaust plate 48 is provided at the bottom portion side of the processing chamber 12 and between the support portion 14 and the inner wall of the processing chamber 12. The gas exhaust plate 48 may be formed by coating aluminum with ceramic, e.g., $Y_2O_3$ or the like. A gas exhaust port 12$e$ is provided below the gas exhaust plate 48 in the processing chamber 12. A gas exhaust unit (EU) 50 is connected to the gas exhaust port 12$e$ through a gas exhaust line 52. The gas exhaust unit 50 includes a vacuum pump such as a turbo molecular pump or the like so that a pressure in the space in the processing chamber 12 can be decreased to a predetermined vacuum level when performing the plasma processing. Further, a loading/unloading port 12$g$ for the wafer W is provided at the sidewall of the processing chamber 12. The loading/unloading port 12$g$ can be opened and closed by a gate valve 54.

The operation of the plasma processing apparatus 10 configured as mentioned above is integrally controlled by a control unit 100. The control unit 100 is, e.g., a computer and controls the respective components of the plasma processing apparatus 10. The operation of the plasma processing apparatus 10 is integrally controlled by the control unit 100.

Figure 2:
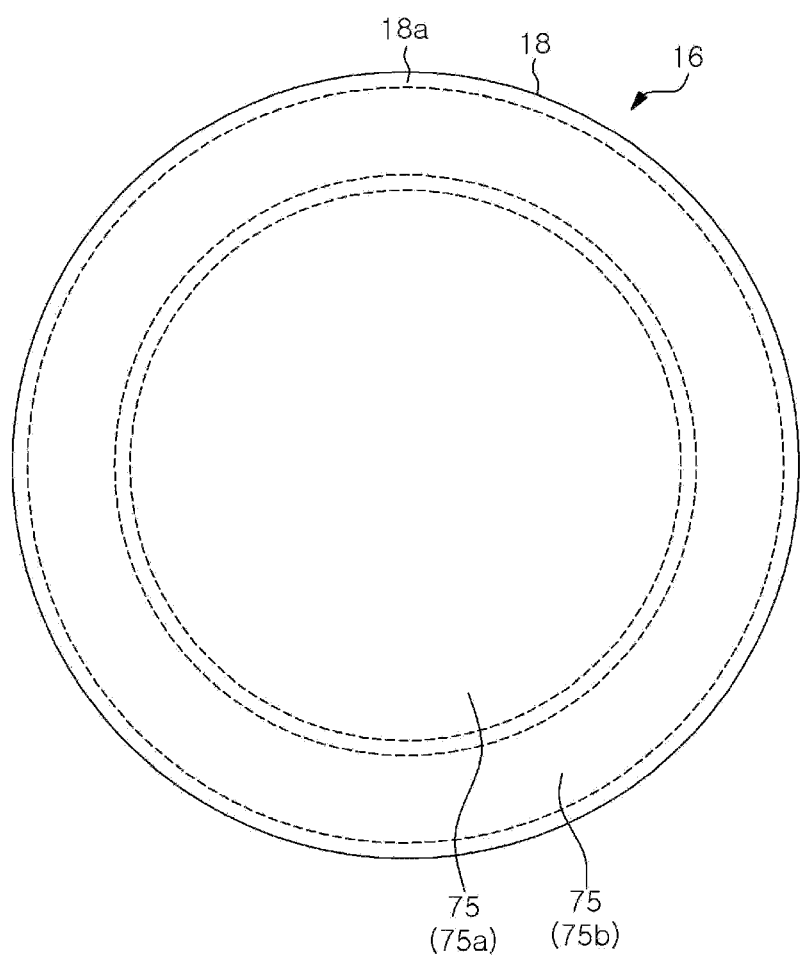
FIG. 2 is a plan view showing a mounting table according to the first embodiment.

(Configuration of Mounting Table) Next, the mounting table 16 will be described in detail. FIG. 2 is a plan view showing the mounting table according to the first embodiment. As described above, the mounting table 16 includes the electrostatic chuck 18 and the base 20. The electrostatic chuck 18 is formed of ceramic, and an upper surface thereof is a mounting region 18$a$ on which the wafer W and the focus ring FR are mounted. The mounting region 18$a$ becomes a substantially circular region in the plan view. As shown in FIG. 1, the electrostatic chuck 18 includes the electrode μl for electrostatic adsorption in a region where the wafer W is disposed. The electrode μl is connected to the DC power supply 22 through the switch SW1.

As shown in FIG. 1, heaters HT are provided below the electrode μl in the mounting region (mounting surface) 18$a$.

The mounting region 18$a$ is divided into a plurality of division regions 75, and the heaters HT are provided in the division regions 75, respectively. For example, as shown in FIG. 2, the mounting region 18$a$ includes a central circular division region 75$a$ and an annular division region 75$b$. The heaters HT are provided in the division region 75$a$ and 75$b$, respectively. For example, a heater HT1 is provided in the division region 75$a$ and a heater HT2 is provided in the division region 75$b$. The wafer W is disposed on the division region 75$a$. The focus ring FR is disposed on the division region 75$b$. In the present embodiment, the upper surface (mounting surface) of the mounting table 16 is divided into two division regions 75$a$ and 75$b$ to perform the temperature control. However, the number of division regions 75 is not limited to two, and may be three or more.

The heaters HT are individually connected to the heater power supply HP shown in FIG. 1 through wirings (not shown). The heater power supply HP supplies individually adjusted electric powers to the heaters HT under the control of the control unit 100. As a result, the heat generated by each heater HT is individually controlled, and the temperatures of the division regions 75 in the mounting region 18$a$ are individually adjusted.

The heater power supply HP includes a power detection unit PD configured to detect a supply power supplied to each heater HT. Further, the power detection unit PD may be provided separately from the heater power supply HP by disposing on a wiring through which electric power flows from the heater power supply HP to each heater HT. The power detection unit PD detects the supply power supplied to each heater HT. For example, the power detection unit PD detects the amount of power [W] as the supply power supplied to each heater HT. The heater HT generates heat in accordance with the amount of power. For this reason, the amount of power supplied to the heater HT indicates a heater power. The power detection unit PD notifies the control unit 100 of power data indicating the detected supply power to each heater HT.

Further, the mounting table 16 includes a temperature sensor (not shown) configured to detect a temperature of the heater HT in each division region 75 of the mounting region 18$a$. The temperature sensor may be an element that measures the temperature while providing separately from the heater HT. Further, the temperature sensor may be an element that is disposed on a wiring through which electric power flows to the heater HT and detects the temperature by using the property in which electrical resistance increases as the temperature increases. Sensing values detected by each temperature sensor are sent to a temperature measuring unit TD. The temperature measuring unit TD measures a temperature of each division region 75 of the mounting region 18$a$ from the respective sensor values. The temperature measuring unit TD notifies the control unit 100 of temperature data indicating the temperature of each division region 75 of the mounting region 18$a$.

Further, heat transfer gas such as He gas may be supplied between the upper surface of the electrostatic chuck 18 and the rear surface of the wafer W by a heat transfer gas supply mechanism and a gas supply line that are not illustrated.

(Configuration of Control Unit)

Figure 3:
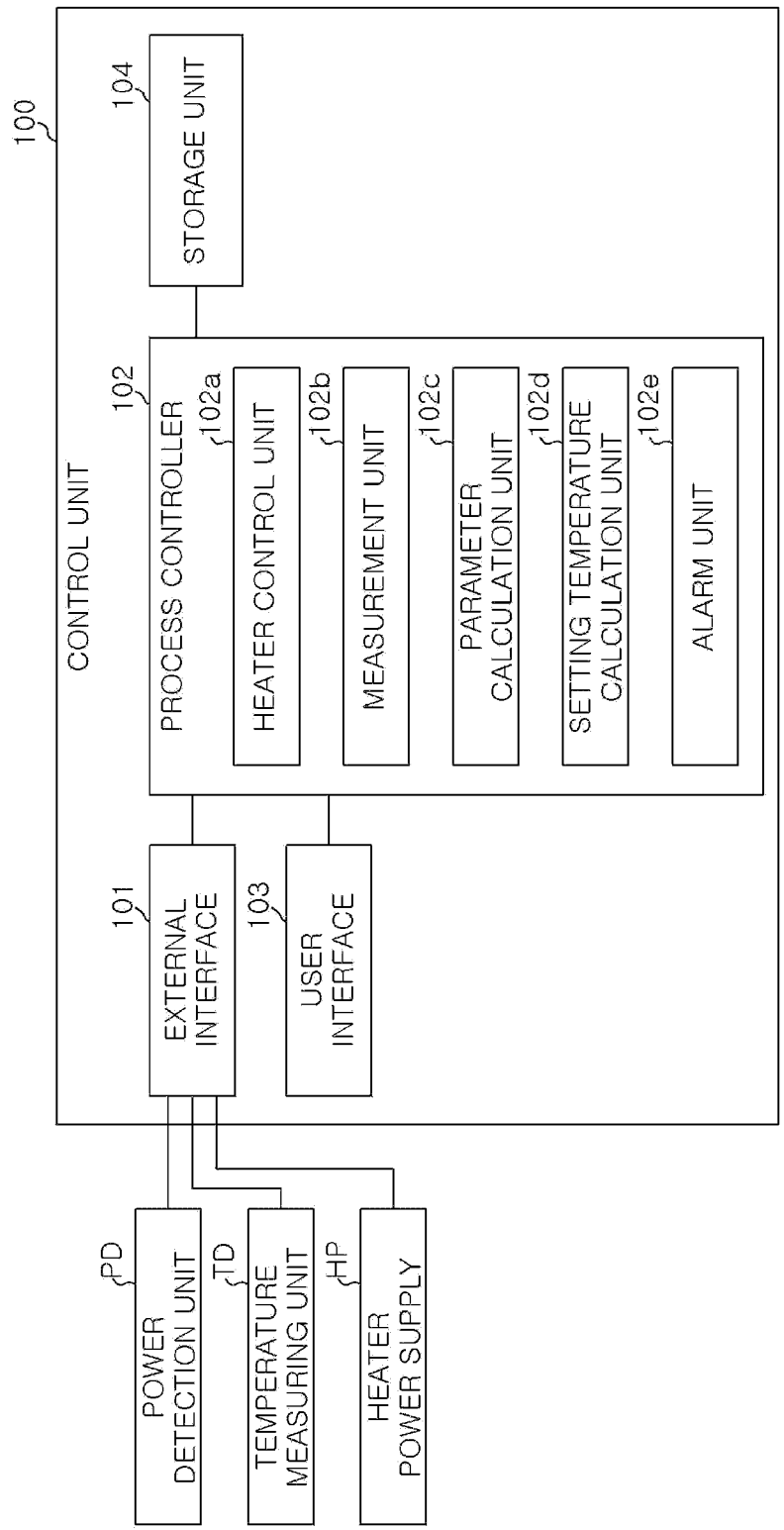
FIG. 3 is a block diagram showing an example of a schematic configuration of a control unit that controls the plasma processing apparatus according to the first embodiment.

Next, the control unit 100 will be described in detail. FIG. 3 is a block diagram showing an example of a schematic configuration of the control unit 100 that controls the plasma processing apparatus according to the first embodiment. The control unit 100 may be, e.g., a computer and includes an external interface 101, a process controller 102, a user interface 103, and a storage unit 104.

The external interface 101 is configured to communicate with the respective components of the plasma processing apparatus 10 to input and output various types of data. For example, power data indicating the supply power from the power detection unit PD to each heater HT is input to the external interface 101. Further, temperature data indicating the temperature of each division region 75 of the mounting region 18a is input to the external interface 101 from the temperature measuring unit TD. Further, the external interface 101 outputs to the heater power supply HP control data for controlling the supply power supplied to each heater HT.

The process controller 102 includes a central processing unit (CPU) and controls the respective components of the plasma processing apparatus 10.

The user interface 103 includes a keyboard through which a process manager input commands to manage the plasma processing apparatus 10, a display for visualizing and displaying an operation status of the plasma processing apparatus 10, and the like.

The storage unit 104 stores therein a control program (software) for realizing various processes performed by the plasma processing apparatus 10 under the control of the process controller 102 and recipes including processing condition data and the like. The storage unit 104 also stores parameters relating to an apparatus, a process, and the like for performing plasma processing. Further, the control program, the recipe, and the parameters may be stored in a computer-readable storage medium (e.g., a hard disk, an optical disk such as a DVD, a flexible disk, a semiconductor memory, or the like). Alternatively, the control program, the recipe, and the parameters may be stored in another device to be read online, e.g., through a dedicated line and used.

The process controller 102 includes an internal memory for storing a program or data, reads out the control program stored in the storage unit 104, and executes processing of the read-out control program. The process controller 102 serves as various processing units by executing the control program. For example, the process controller 102 serves as a heater control unit 102a, a measurement unit 102b, a parameter calculation unit 102c, a setting temperature calculation unit 102d, and an alarm unit 102e. Further, in the present embodiment, although the case where the process controller 102 serves as various processing units will be described as an example, the present disclosure is not limited thereto. For example, the functions of the heater control unit 102a, the measurement unit 102b, the parameter calculation unit 102c, the setting temperature calculation unit 102d, and the alarm unit 102e may be distributed and realized by a plurality of controllers and realized.

However, in plasma processing, the progress of processing changes depending on the temperature. For example, in plasma etching, the progress speed of etching changes depending on the temperatures of the wafer W and the focus ring FR. Therefore, in the plasma processing apparatus 10, it is conceivable to control the temperatures of the wafer W and the focus ring FR to a target temperature by using each heater HT.

Figure 4:
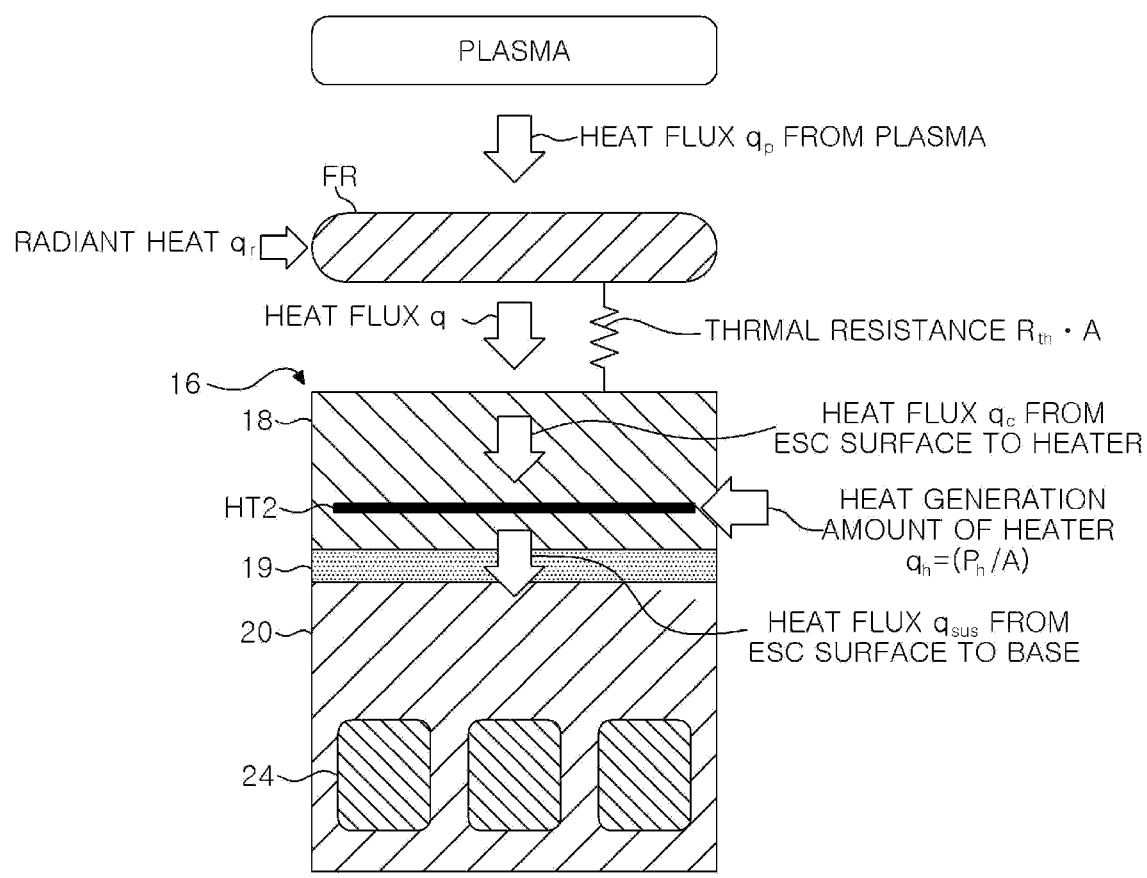
FIG. 4 is a diagram schematically showing a flow of energy affecting a temperature of a focus ring.

A flow of energy affecting the temperatures of the wafer W and the focus ring FR will be described. Hereinafter, the flow of energy affecting the temperature of the focus ring FR will be described only, but the flow of energy affecting the temperature of the wafer W is similar thereto. FIG. 4 schematically shows the flow of energy affecting the temperature of the focus ring. In FIG. 4, the focus ring FR and the mounting table 16 including the electrostatic chuck (ESC) 18 are illustrated in a simplified manner. Further, in an example of FIG. 4, the flow of energy affecting the temperature of the focus ring FR with respect to one division region 75 (the division region 75b) of the mounting region 18a of the electrostatic chuck 18 is shown. The mounting table 16 includes the electrostatic chuck 18 and the base 20. The electrostatic chuck 18 and the base 20 are bonded by a bonding layer 19. The heater HT (the heater HT2) is provided in the electrostatic chuck 18. The coolant channel 24 through which a coolant flows is formed in the base 20.

The heater HT2 generates heat by the power supplied from the heater power supply HP, and a temperature thereof increases. In FIG. 4, the power supplied to the heater HT2 is denoted as a heater power $P_h$. In the heater HT2, a heat generation amount (heat flux) $q_h$ per unit area, which is obtained by dividing the heater power $P_h$ by an area A of the region where the heater HT2 of the electrostatic chuck 18 is provided, is generated.

In the plasma processing apparatus 10, when temperatures of internal parts arranged in the processing chamber 12 such as the upper electrode 30 and the deposition shield 46 are controlled, radiant heat is generated from the internal parts. For example, when the temperatures of the upper electrode 30 and the deposition shield 46 are controlled at a high temperature to suppress adhesion of deposits, the radiant heat is input to the focusing ring FR from the upper electrode 30 and the deposition shield 46. In FIG. 4, the radiant heat from the upper electrode 30 and/or the deposition shield 46 to the focus ring FR is denoted as "$q_r$."

Further, when the plasma processing is performed, heat is input to the focus ring FR from the plasma. In FIG. 4, heat flux from the plasma per unit area, which is obtained by dividing the heat amount from the plasma to the focus ring FR by an area of the focus ring FR, is denoted as "$q_p$." The temperature of the focus ring FR is increased by input of the heat flux $q_p$ from the plasma and input of the radiant heat $q_r$.

The heat input by the radiant heat is proportional to the temperatures of the internal parts of the processing chamber 12. For example, the heat input by the radiant heat is proportional to the fourth power of the temperatures of the upper electrode 30 and/or the deposition shield 46. It is known that the heat input from the plasma is proportional to the product of the amount of ions in the plasma irradiated to the focus ring FR and a bias potential for attracting the ions in the plasma to the focus ring FR. The amount of ions in the plasma irradiated to the focus ring FR is proportional to an electron density of the plasma. The electron density of the plasma is proportional to the high-frequency power of the first high-frequency power supply HFS applied for the plasma generation. Further, the electron density of the plasma depends on a pressure inside the processing chamber 12. The bias potential for attracting the ions in the plasma to the focus ring FR is proportional to the high-frequency power of the second high-frequency power supply LFS applied for the bias potential generation. Further, the bias potential for attracting the ions in the plasma to the focus ring FR depends on the pressure inside the processing chamber 12. When the high-frequency power is not applied to the mounting table 16, the ions are attracted to the mounting table 16 by a potential difference between a plasma potential generated when the plasma is generated and a potential of the mounting table 16.

Further, the heat input from the plasma includes irradiation to the focus ring FR by electrons or radicals in the plasma or heating by light emission of the plasma, a surface reaction on the focus ring FR due to ions and radicals, and the like. These components also depend on the powers of the high-frequency power supplies and/or the pressure inside the processing chamber 12. In addition, the heat input from the plasma also depends on device parameters relating to the plasma generation, such as the distance between the mounting table 16 and the upper electrode 30 or the type of gas supplied to the processing space S.

The heat transferred to the focus ring FR is transferred to the electrostatic chuck 18. Here, not all the heat of the focus ring FR is transferred to the electrostatic chuck 18, and the heat is transferred to the electrostatic chuck 18 depending on the difficulty of heat transfer such as the degree of contact between the focus ring FR and the electrostatic chuck 18. The difficulty of heat transfer, which is the thermal resistance, is inversely proportional to a sectional area normal to a heat transfer direction. For this reason, in FIG. 4, the difficulty of heat transfer from the focus ring FR to a surface of the electrostatic chuck 18 is denoted as the thermal resistance $R_{th} \cdot A$ per unit area between the focus ring FR and the surface of the electrostatic chuck 18 where A is the area of the region (division region 75b) where the heater HT2 is provided. $R_{th}$ is a thermal resistance in the whole region where the heater HT2 is provided. Further, in FIG. 4, the heat input amount from the focus ring FR to the surface of the electrostatic chuck 18 is denoted as heat flux q per unit area from the focus ring FR to the surface of the electrostatic chuck 18. Further, the thermal resistance $R_{th} \cdot A$ depends on the surface state of the electrostatic chuck 18, the value of a DC voltage applied from the DC power supply 22 during the holding of the focus ring FR, and the pressure of the heat transfer gas supplied between an upper surface of the electrostatic chuck 18 and a rear surface of the focus ring FR. In addition, the thermal resistance $R_{th} \cdot A$ also depends on device parameters involved in the thermal resistance or thermal conductivity.

The heat transferred to the surface of the electrostatic chuck 18 increases the temperature of the electrostatic chuck 18 and is also transferred to the heater HT2. In FIG. 4, a heat input amount from the surface of the electrostatic chuck 18 to the heater HT2 is denoted as heat flux $q_c$ per unit area from the surface of the electrostatic chuck 18 to the heater HT2.

Meanwhile, the base 20 is cooled by a coolant flowing through the coolant channel 24 and cools the electrostatic chuck 18 being in contact therewith. At this time, in FIG. 4, a heat loss amount from a rear surface of the electrostatic chuck 18 to the base 20 through the bonding layer 19 is denoted as heat flux $q_{sus}$ per unit area from the rear surface of the electrostatic chuck 18 to the base 20. The heater HT2 is cooled by this heat loss, and thereby, the temperature is reduced.

The focus ring FR is consumed and its thickness becomes thinner by etching. In the plasma processing apparatus 10, when the focus ring FR is consumed and the thickness thereof is reduced, the amount of heat input to the heater HT during plasma processing changes.

Figure 5:
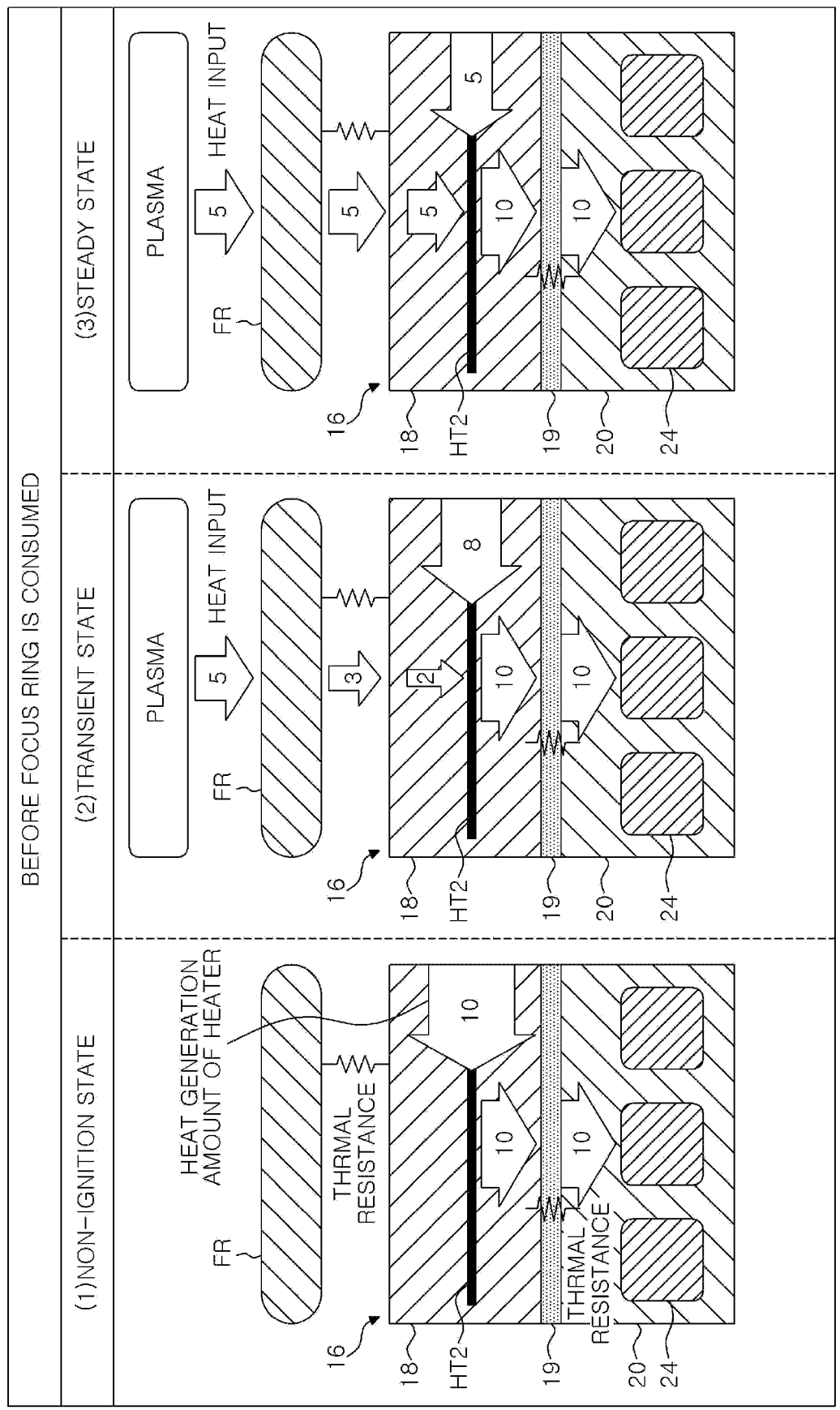
FIG. 5 is a diagram schematically showing a flow of energy before the focus ring is consumed.

Here, the change in the amount of heat input to the heater HT2 due to the consumption of the focus ring FR will be described. FIG. 5 schematically shows a flow of energy before the focus ring is consumed. In addition, the heat input of the radiant heat is omitted due to a small influence.

When the temperature of the heater HT2 is controlled to be constant, the sum of the heat input amount input to the heater HT2 and the heat generation amount generated by the heater HT2 is equal to the heat loss amount lost from the heater HT2, at a position of the heater HT2. For example, in a non-ignition state in which the plasma is not ignited, the sum of the heat generation amount generated by the heater HT2 is equal to the heat loss amount lost from the heater HT2. In an example of the "non-ignition state" shown in FIG. 5, the heat amount of "10" is lost from the heater HT2 by the cooling from the base 20. When the temperature of the heater HT2 is controlled to be constant, the heat amount of "10" is generated in the heater HT2 by the heater power $P_h$ from the heater power supply HP.

In an ignition state in which the plasma is ignited, the heat from the plasma is also input to the heater HT2 through the electrostatic chuck 18. The ignition state includes a transient state and a steady state. In the transient state, for example, a heat input amount of the focusing ring FR or the electrostatic chuck 18 is greater than the heat loss amount thereof, and thereby, the temperature of the focus ring FR or the electrostatic chuck 18 tends to increase over time. In the steady state, the heat input amount and the heat loss amount of the focus ring FR or the electrostatic chuck 18 are equal to each other, and thereby, the temperature of the focus ring FR or the electrostatic chuck 18 does not tend to increase over time, and the temperature becomes substantially constant.

Further, in the ignition state, the temperature of the focus ring FR increases due to the heat input from the plasma until the wafer reaches the steady state. To the heater HT2, heat is transferred from the focus ring FR through the electrostatic chuck 18. As described above, when the temperature of the heater HT2 is controlled to be constant, the heat amount input to the heater HT2 is equal to the heat amount lost from the heater HT2. The heat amount required for maintaining the temperature of the heater HT2 to be constant is reduced in the heater HT2. For this reason, the power supplied to the heater HT2 is reduced.

For example, in an example of the "transient state" shown in FIG. 5, a heat amount of "5" is transferred from the plasma to the focus ring FR. Further, the heat transferred to the focus ring FR is transferred to the electrostatic chuck 18. Further, when the temperature of the focus ring FR is not in the steady state, a part of the heat transferred to the focus ring FR contributes to an increase of the temperature of the focus ring FR. The heat amount contributing to the increase in the temperature of the focus ring FR depends on the heat capacity of the focus ring FR. Therefore, the heat amount of "3" among the heat amount of "5" transferred to the focus ring FR is transferred from the focus ring FR to the surface of the electrostatic chuck 18. The heat transferred to the surface of the electrostatic chuck 18 is transferred to the heater HT2. Further, when the temperature of the electrostatic chuck 18 is not in the steady state, a part of the heat transferred to the surface of the electrostatic chuck 18 contributes to an increase in the temperature of the electrostatic chuck 18. The heat amount contributing to the increase in the temperature of the electrostatic chuck 18 depends on the heat capacity of the electrostatic chuck 18. Therefore, a heat amount of "2" among the heat amount of "3" transferred to the surface of the electrostatic chuck 18 is transferred to the heater HT2. For this reason, when the temperature of the heater HT2 is controlled to be constant, a heat amount of "8" is supplied to the heater HT2 by the heater power $P_h$ from the heater power supply HP.

Further, in an example of the "steady state" shown in FIG. 5, the heat amount of "5" is transferred from the plasma to the focus ring FR. The heat transferred to the focus ring FR is transferred to the electrostatic chuck 18. Further, when the temperature of the focus ring FR is in the steady state, the heat input amount and the heat output amount of the focus ring FR are equal to each other. Therefore, the heat amount of "5" transferred from the plasma to the focus ring FR is transferred from the focus ring FR to the surface of the electrostatic chuck 18. The heat transferred to the surface of the electrostatic chuck 18 is transferred to the heater HT2.

When the temperature of the electrostatic chuck 18 is in the steady state, a heat input amount and a heat output amount of the electrostatic chuck 18 are equal to each other. Therefore, the heat amount of "5" transferred to the surface of the electrostatic chuck 18 is transferred to the heater HT2. For this reason, when the temperature of heater HT2 is controlled to be constant, a heat amount of "5" is supplied to the heater HT2 by the heater power $P_h$ from the heater power supply HP.

Figure 6:
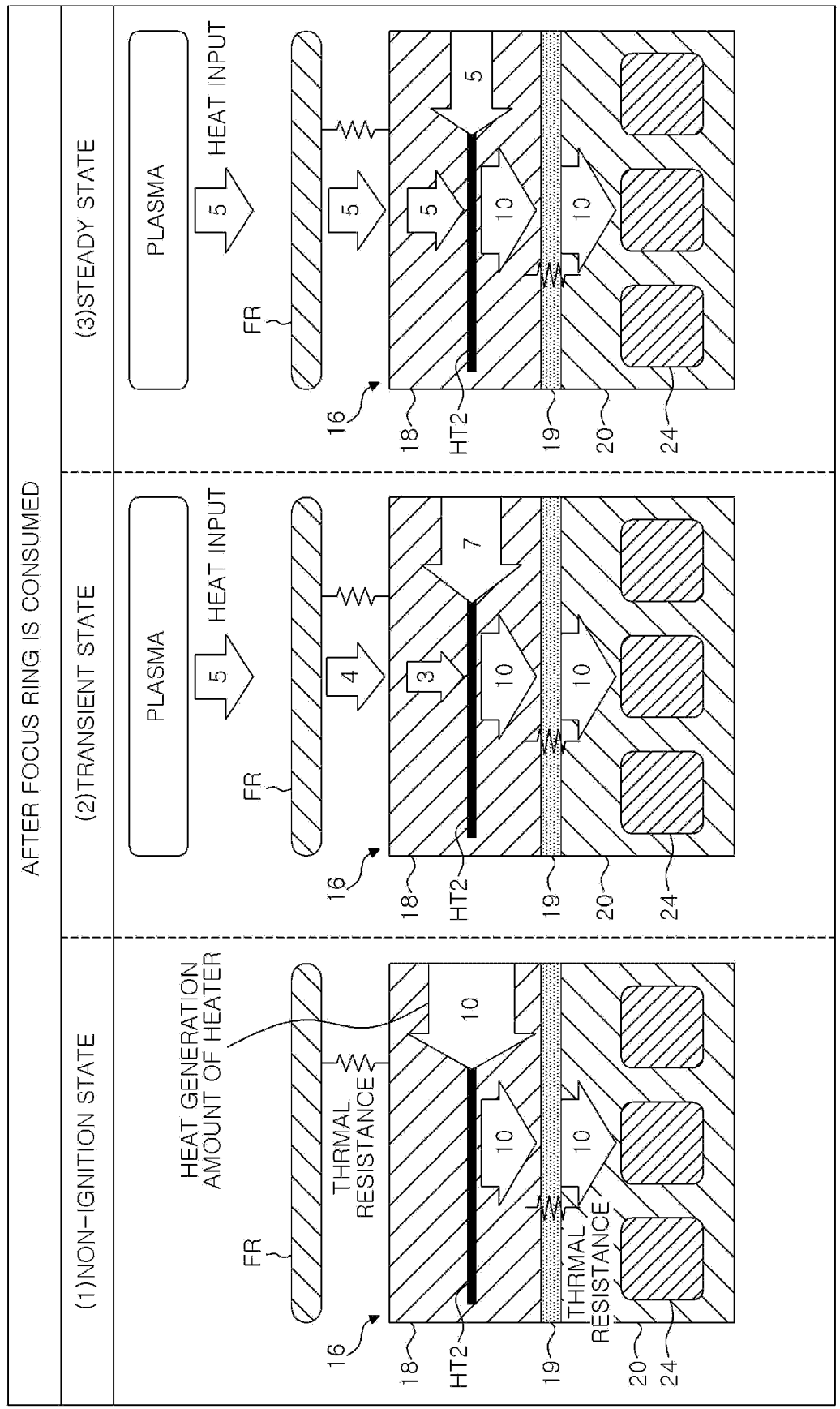
FIG. 6 is a diagram schematically showing a flow of energy after the focus ring is consumed.

FIG. 6 schematically shows a flow of energy after the focus ring is consumed. The heat input of the radiant heat is omitted due to a small influence. In FIG. 6, since the focus ring FR is consumed by the etching, the focus ring FR has a thickness thinner than that of FIG. 5.

In the non-ignition state, even when the focus ring FR is consumed and its thickness is reduced, the flow of energy is the same as that before the consumption of the focus ring FR shown in FIG. 5. In an example of the "non-ignition state" shown in FIG. 6, the heat amount of "10" is lost from the heater HT2 by the cooling from the base 20. When the temperature of the heater HT2 is controlled to be constant, the heat amount of "10" is generated in the heater HT2 by the heater power $P_h$ from the heater power supply HP.

In the ignition state, the heat from the plasma is also input to the heater HT2 through the electrostatic chuck 18. When the focus ring FR is consumed and its thickness is reduced, the heating time of the focus ring FR is shortened.

For example, in an example of the "transient state" shown in FIG. 6, a heat amount of "5" is transferred from the plasma to the focus ring FR. Further, the heat transferred to the focus ring FR is transferred to the electrostatic chuck 18. Further, when the temperature of the focus ring FR is not in the steady state, a part of the heat transferred to the focus ring FR contributes to an increase of the temperature of the focus ring FR. For example, when the focus ring FR is consumed and its thickness is reduced, the heat amount of "4" among the heat amount of "5" transferred to the focus ring FR is transferred from the focus ring FR to the surface of the electrostatic chuck 18. The heat transferred to the surface of the electrostatic chuck 18 is transferred to the heater HT2. Further, when the temperature of the electrostatic chuck 18 is not in the steady state, a part of the heat transferred to the surface of the electrostatic chuck 18 contributes to an increase in the temperature of the electrostatic chuck 18. The heat amount contributing to the increase in the temperature of the electrostatic chuck 18 depends on the heat capacity of the electrostatic chuck 18. Therefore, a heat amount of "3" among the heat amount of "4" transferred to the surface of the electrostatic chuck 18 is transferred to the heater HT2. For this reason, when the temperature of the heater HT2 is controlled to be constant, a heat amount of "7" is supplied to the heater HT2 by the heater power $P_h$ from the heater power supply HP.

Further, in an example of the "steady state" shown in FIG. 6, the heat amount of "5" is transferred from the plasma to the focus ring FR. The heat transferred to the focus ring FR is transferred to the electrostatic chuck 18. Further, when the temperature of the focus ring FR is in the steady state, the heat input amount and the heat output amount of the focus ring FR are equal to each other. Therefore, the heat amount of "5" transferred from the plasma to the focus ring FR is transferred from the focus ring FR to the surface of the electrostatic chuck 18. The heat transferred to the surface of the electrostatic chuck 18 is transferred to the heater HT2. When the temperature of the electrostatic chuck 18 is in the steady state, a heat input amount and a heat output amount of the electrostatic chuck 18 are equal to each other. Therefore, the heat amount of "5" transferred to the surface of the electrostatic chuck 18 is transferred to the heater HT2. For this reason, when the temperature of heater HT2 is controlled to be constant, a heat amount of "5" is supplied to the heater HT2 by the heater power $P_h$ from the heater power supply HP.

As illustrated in FIGS. 5 and 6, the power supplied to the heater HT2 is lower in the ignition state than that in the non-ignition state. Further, in the ignition state, the power supplied to the heater HT2 is lowered until the steady state. Further, in the transient state, even if the amount of heat input from the plasma is the same, the power supplied to the heater HT2 changes depending on the thickness of the focus ring FR.

Further, as shown in FIGS. 5 and 6, when the temperature of the heater HT2 is controlled to be constant, even if the state is any of the "non-ignition state," the "transient state," and the "steady state," the heat amount of "10" is lost from the heater HT2 by the cooling from the base 20. That is, the heat flux $q_{sus}$ per unit area from the heater HT2 to the coolant supplied to the coolant channel 24 formed inside the base 20 is always constant, and a temperature gradient from the heater HT2 to the coolant is always constant. For this reason, the temperature sensor used to control the temperature of the heater HT2 to be constant does not need to be directly installed in the heater HT2. For example, the temperature difference between the heater HT2 and the temperature sensor is always constant as long as the temperature sensor is installed between the heater HT2 and the coolant, such as the rear surface of the electrostatic chuck 18, inside of the bonding layer 19, and inside of the base 20. Thus, by calculating the temperature difference $\Delta T$ between the temperature sensor and the heater HT2 using thermal conductivity, thermal resistance, and the like of a material between the heater HT2 and the temperature sensor and by adding the temperature difference $\Delta T$ to a value of the temperature detected by the temperature sensor, it is possible to output the temperature of the heater HT2 and to control the actual temperature of the heater HT2 so as to be constant.

Figure 7:
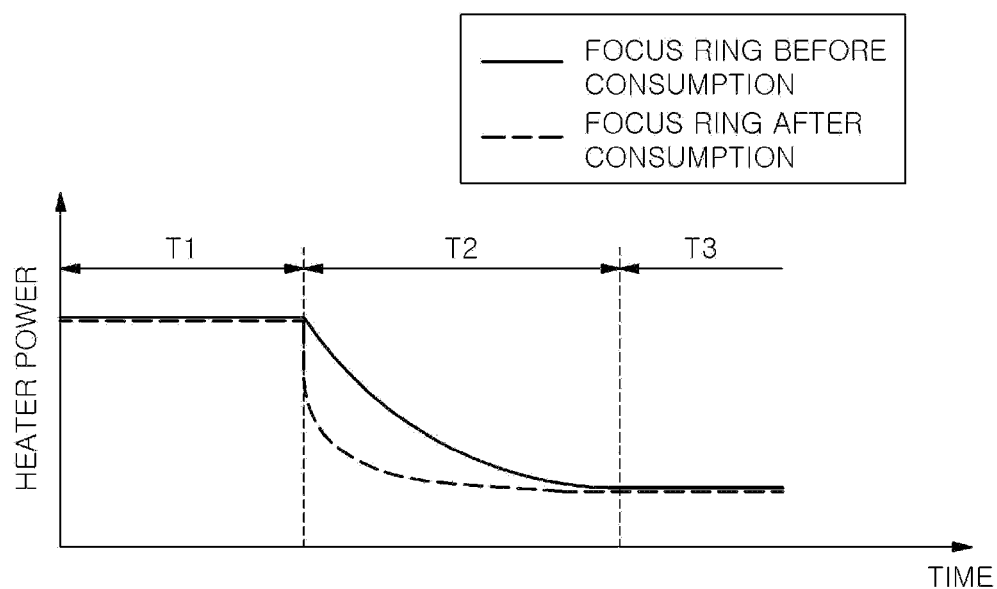
FIG. 7 shows an example of a change in a temperature of the focus ring and a change in a supply power to a heater.

FIG. 7 shows an example of a change in the temperature of the focus ring and a change in the supply power to the heater. FIG. 7 illustrates an example of a result of measuring the temperature of the focus ring FR and the supply power to the heater HT2 by controlling the temperature of the heater HT2 so as to be constant, and igniting the plasma from the non-ignition state in which the plasma is not ignited. A solid line shown in FIG. 7 denotes a change in the supply power to the heater HT2 in the case of a new focus ring FR (before consumption). The dashed line shown in FIG. 7 denotes a change in the supply power to the heater HT2 in the case of the focus ring FR after the new focus ring FR is consumed and its thickness has become thinner than before.

A period T1 shown in FIG. 7 is the non-ignition state in which the plasma is not ignited. In the period T1, the supply power to the heater HT2 is constant. A period T2 shown in FIG. 7 is the ignition state in which the plasma is ignited and in the transient state. In the period T2, the supply power to the heater HT2 is decreased. In the period T2, the temperature of the focus ring FR increases to a certain temperature. A period T3 shown in FIG. 7 is the ignition state in which the plasma is ignited. In the period T3, the temperature of the focus ring FR becomes constant and in the steady state. If the electrostatic chuck 18 also enters the steady state, a tendency of the supply power to decrease stabilizes and the supply power to the heater HT2 becomes substantially constant.

The tendency of the power supplied to the heater HT2 to decrease in the transient state, illustrated in the period T2 of FIG. 7, is changed due to the heat input amount from the plasma to the focus ring FR, the thermal resistance between the focus ring FR and the surface of the electrostatic chuck 18, the thickness of the focus ring FR and the like.

As described above, when the temperature of the heater HT2 is controlled to be constant, the heater power $P_h$ changes depending on the heat input amount from the plasma to the focus ring FR, the thermal resistance between the focus ring FR and the surface of the electrostatic chuck 18 and/or the thickness of the focus ring FR. Therefore, a graph of the supply power to the heater HT2 in the period T2 shown in FIG. 7 may be modeled by taking the heat input amount from the plasma to the focus ring FR, the thermal resistance between the focus ring FR and the surface of the electrostatic chuck 18 and/or the thickness of the focus ring FR as parameters. That is, a change in the supply power to the heater HT2 in the period T2 may be modeled by calculation equations by taking the heat input amount from the plasma to the focus ring FR, the thermal resistance between the focus ring FR and the surface of the electrostatic chuck 18 and the thickness of the focus ring FR as parameters.

In the present embodiment, the change in the supply power to the heater HT2 in the period T2 shown in FIG. 7 is modeled as an equation based on unit area. For example, the heat generation amount $q_h$ from the heater HT2 per unit area when a heat flux is generated from the plasma may be expressed by the following equation (2) in an equation group 1. The heat generation amount $q_{h0}$ from the heater HT per unit area in the steady state when no heat flux is generated from the plasma may be expressed by the following equation (3) in the equation group 1. The thermal resistance $R_{thc} \cdot A$ per unit area between the surface of the electrostatic chuck 18 and the heater HT2 may be expressed by the following equation (4) in the equation group 1. When $a_1$, $a_2$, $a_3$, $\lambda_1$, $\lambda_2$, $\tau_1$, and $\tau_2$ are expressed by the following equations (5) to (11) in the equation group 1 by taking the heat flux $q_p$ and the thermal resistance $R_{th}$ as parameters, the heat generation amount $q_h$ may be expressed by the following equation (1) in the equation group 1.

(Equation Group 1)

$$q_h = q_{h0} - q_p - \frac{R_{th} \cdot A \cdot q_p}{R_{thc} \cdot A \cdot (\lambda_1 - \lambda_2)} \left\{ \left(1 + \frac{a_2 + a_3}{a_1 \cdot a_3} \cdot \lambda_2\right)(a_1 + \lambda_1) \exp\left(-\frac{t}{\tau_1}\right) - \left(1 + \frac{a_2 + a_3}{a_1 \cdot a_3} \cdot \lambda_1\right)(a_1 + \lambda_2) \exp\left(-\frac{t}{\tau_2}\right) \right\} \quad (1)$$

$$q_h = P_h/A \quad (2)$$

$$q_{h0} = P_{h0}/A \quad (3)$$

$$R_{thc} \cdot A = \frac{z_c}{\kappa_c} \quad (4)$$

$$a_1 = \frac{1}{\rho_{FR} \cdot C_{FR} \cdot z_{FR} \cdot R_{th} \cdot A} \quad (5)$$

$$a_2 = \frac{2}{\rho_c \cdot C_c \cdot z_c \cdot R_{th} \cdot A} \quad (6)$$

$$a_3 = \frac{2}{\rho_c \cdot C_c \cdot z_c \cdot R_{thc} \cdot A} \quad (7)$$

$$\lambda_1 = \frac{1}{2}\left\{-(a_1 + a_2 + a_3) + \sqrt{(a_1 + a_2 + a_3)^2 - 4a_1 a_3}\right\} \quad (8)$$

$$\lambda_2 = \frac{1}{2}\left\{-(a_1 + a_2 + a_3) - \sqrt{(a_1 + a_2 + a_3)^2 - 4a_1 a_3}\right\} \quad (9)$$

$$\tau_1 = -\frac{1}{\lambda_1} \quad (10)$$

$$\tau_1 = -\frac{1}{\lambda_2} \quad (11)$$

In the equation group 1, $P_h$ is the heater power [W] when the heat flux is generated from the plasma.

$P_{h0}$ is the heater power [W] in the steady state when no heat flux is generated from the plasma.

$q_h$ is the heat generation amount [W/m$^2$] from the heater HT2 per unit area when the heat flux is generated from the plasma.

$q_{h0}$ is the heat generation amount [W/m$^2$] from the heater HT2 per unit area in the steady state when no heat flux is generated from the plasma.

$q_p$ is the heat flux [W/m$^2$] per unit area from the plasma to the focus ring FR.

$R_{th} \cdot A$ is the thermal resistance [K·m$^2$/W] per unit area between the focus ring FR and the surface of the electrostatic chuck 18.

$R_{thc} \cdot A$ is the thermal resistance [K·m$^2$/W] per unit area between the surface of the electrostatic chuck 18 and the heater.

A is the area [m$^2$] of the division region 75 (the division region 75b) in which the heater HT2 is provided.

$\rho_{FR}$ is the density [kg/m$^3$] of the focus ring FR.

$C_{FR}$ is the heat capacity [J/K·m$^2$] per unit area of the focus ring FR.

$z_{FR}$ is the thickness [m] of the focus ring FR.

$\rho_c$ is the density [kg/m$^3$] of ceramic forming the electrostatic chuck 18.

$C_c$ is the heat capacity [J/K·m$^2$] per unit area of the ceramic forming the electrostatic chuck 18.

$z_c$ is the distance [m] from the surface of the electrostatic chuck 18 to the heater HT2.

$\kappa_c$ is the thermal conductivity [W/K·m] of the ceramic forming the electrostatic chuck 18.

t is the elapsed time [sec] after the plasma is ignited.

Regarding $a_1$ expressed in the equation (5), $1/a_1$ is a time constant indicating the difficulty of warming the focus ring FR. Further, with respect to $a_2$ expressed in the equation (6), $1/a_2$ is a time constant indicating the difficulty of heat input into the electrostatic chuck 18 and the difficulty of warming the electrostatic chuck 18. Further, with respect to $a_3$ expressed in the equation (7), $1/a_3$ is a time constant indicating the difficulty of heat infiltration into the electrostatic chuck 18 and the difficulty of warming the electrostatic chuck 18.

The density $\rho_{FR}$ of the focus ring FR and the heat capacity $C_{FR}$ per unit area of the focus ring FR are determined in advance from an actual configuration of the focus ring FR, respectively. The area A of the heater HT2, the density $\rho_c$ of ceramic forming the electrostatic chuck 18, and the heat capacity $C_c$ per unit area of the ceramic forming the electrostatic chuck 18 are determined in advance from the actual configuration of the plasma processing apparatus 10, respectively. The distance $z_c$ from the surface of the electrostatic chuck 18 to the heater HT2 and the thermal conductivity $\kappa_c$ of the ceramic forming the electrostatic chuck 18 are also determined in advance from the actual configuration of the plasma processing apparatus 10. $R_{thc} \cdot A$ is determined in advance by the equation (4) from the thermal conductivity $\kappa_c$ and the distance $z_c$.

The thickness $z_{FR}$ of the focus ring FR is determined to be a specific value in the case of the new focus ring FR, but the value of the thickness $z_{FR}$ changes as the new focus ring FR is consumed by etching. Therefore, when the focus ring FR is consumed, the thickness $z_{FR}$ of the focus ring FR also becomes a parameter.

The plasma processing apparatus 10 may perform plasma processings with various process recipes. The heat input amount from the plasma to the focus ring FR and the thermal resistance between the focus ring FR and the surface of the electrostatic chuck 18 during the plasma processing can be obtained as follows.

For example, the plasma processing apparatus 10 performs the plasma processing after a new focus ring FR is disposed and measures the heater power $P_{h0}$ of the heater HT2 during the plasma processing.

The heater power $P_h$ when there is heat flux from the plasma for each elapsed time t after the plasma is ignited, and the heater power $P_{h0}$ in the steady state when there is no heat flux from the plasma may be obtained from the measurement results therefor in the plasma processing apparatus 10. As expressed by the equation (2), by dividing the obtained heater power $P_h$ by the area A of the heater HT2, the heat generation amount $q_h$ of the heater HT2 per unit area when there is the heat flux from the plasma may be obtained. Further, as expressed by the equation (3), by dividing the obtained heater power $P_{h0}$ by the area A of the heater HT2, the heat generation amount $q_{h0}$ of the heater HT2 per unit area in the steady state when there is no heat flux from the plasma may be obtained. As for the thickness $z_{FR}$ of the focus ring FR, in the case of the new focus ring FR, the value of the thickness of the new focus ring FR can be used. The thickness of the new focus ring FR may be stored in the storage unit 104 through an input from the user interface 103 or the like, and the value of the thickness stored in the storage unit 104 may be used. Alternatively, the thickness of the new focus ring FR may be obtained by measuring the value thereof by another measuring device through a network or the like.

The heat flux $q_p$ and the thermal resistance $R_{th} \cdot A$ are obtained by performing fitting of the measurement results by using the equations (1) to (11) as the calculation model.

In other words, when the thickness of the focus ring FR is determined to be a specific value as in the case of the new focus ring FR, the plasma processing apparatus 10 performs the fitting with the equations (1) to (11) by using the measurement results, so that the heat flux $q_p$ and the thermal resistance $R_{th} \cdot A$ can be obtained.

In the steady state of FIGS. 5 and 6, the heat input amount from the plasma to the focus ring FR is added from the non-ignition state and is input to the heater HT2 without mitigation. For this reason, the heat input amount from the plasma to the focus ring FR may be calculated from a value of the difference between the supply power in the non-ignition state of the period T1 and the supply power in the steady state of the period T3 shown in FIG. 7. For example, the heat flux $q_p$ may be calculated from a value obtained by calculating a difference between the heater power $P_{h0}$ (in the non-ignition state) when there is no heat flux from the plasma and the heater power $P_h$ in the steady state of the period T3 and converting the difference into a value per unit area, as expressed by the following equation (12). Further, the heat flux $q_p$ may be calculated from a difference between the heat generation amount $q_{h0}$ from the heater HT2 per unit area and the heat generation amount $q_h$ from the heater HT2 per unit area, as expressed by the following equation (12).

$$q_p = (P_{h0} - P_h)/A = q_{h0} - q_h \quad (12)$$

In this manner, the heat input amount from the plasma to the focus ring FR and the thermal resistance between the focus ring FR and the surface of the electrostatic chuck 18 during the plasma processing are obtained. The plasma processing apparatus 10 performs the same plasma processing on each of the loading and unloading wafers W. In this case, the heat input amount from the plasma to the focus ring FR and the thermal resistance between the focus ring FR and the surface of the electrostatic chuck 18 in each plasma processing can be considered to be the same. When the heat input amount and the thermal resistance are obtained, the thickness $z_{FR}$ of the focus ring FR can be obtained as follows.

For example, the plasma processing apparatus 10 performs the plasma processing and measures the heater power $P_{h0}$ of the heater HT2 during the plasma processing.

The heater power $P_h$ when there is heat flux from the plasma for each elapsed time t after the plasma is ignited, and the heater power $P_{h0}$ in the steady state when there is no heat flux from the plasma may be obtained from the measurement results in the plasma processing apparatus 10. Then, as expressed by the equation (2), by dividing the obtained heater power $P_h$ by the area A of the heater HT2, the heat generation amount $q_h$ of the heater HT2 per unit area when there is the heat flux from the plasma may be obtained. Further, as expressed by the equation (3), by dividing the obtained heater power $P_{h0}$ by the area A of the heater HT2, the heat generation amount $q_{h0}$ of the heater HT2 per unit area in the steady state when there is no heat flux from the plasma may be obtained. For the heat flux $q_p$ and the thermal resistance $R_{th} \cdot A$, values obtained using a new focus ring FR are used, for example.

The thickness $z_{FR}$ of the focus ring FR can be obtained by performing the fitting of the measurement results by using the above equations (1) to (11) as the calculation model.

In other words, when the heat flux $q_p$ and the thermal resistance $R_{th} \cdot A$ are determined in advance, the plasma processing apparatus 10 uses the measurement results to perform the fitting with the equations (1) to (11), thereby obtaining the thickness $z_{FR}$ of the focus ring FR.

Further, the graph of the temperature of the focus ring FR in the period T2 shown in FIG. 7 may also be modeled by taking the heat input amount from the plasma to the focus ring FR, the thermal resistance between the focus ring FR and the surface of the electrostatic chuck 18, and the thickness of the focus ring FR as parameters. In the present embodiment, a change in the temperature of the focus ring FR in the period T2 is modeled as an equation based on unit area. For example, when $a_1$, $a_2$, $a_3$, $\lambda_1$, $\lambda_2$, $\tau_1$, and $\tau_2$ illustrated in the equations (5) to (11) are used by taking the heat flux $q_p$, the thermal resistance $R_{th} \cdot A$, and the thickness $z_{FR}$ as parameters, a temperature $T_{FR}$ of the focus ring FR may be expressed by the following equation (13).

$$T_{FR} = T_h + q_p \cdot (R_{th} \cdot A + R_{thc} \cdot A) + \frac{q_P}{\rho_{FR} \cdot C_{FR} \cdot z_{FR} \cdot (\lambda_1 - \lambda_2)} \left\{ \left(1 + \frac{a_2 + a_3}{a_1 \cdot a_3} \cdot \lambda_2\right) \exp\left(-\frac{t}{\tau_1}\right) - \left(1 + \frac{a_2 + a_3}{a_1 \cdot a_3} \cdot \lambda_1\right) \exp\left(-\frac{t}{\tau_2}\right) \right\} \quad (13)$$

Here, $T_{FR}$ is the temperature [° C.] of the focus ring. $T_h$ is the temperature [° C.] of the heater HT2 that is controlled to be constant.

The temperature $T_h$ of the heater may be obtained from the conditions at the actual time of controlling the temperature of the focus ring FR to be constant.

When the heat flux $q_p$, the thermal resistance $R_{th} \cdot A$ and the thickness $z_{FR}$ are obtained, the temperature $T_{FR}$ of the focus ring FR may be calculated from the equation (13).

When the elapsed time t is sufficiently longer than the time constants $\tau_1$ and $\tau_2$ expressed in the equations (10) and (11), the equation (13) may be omitted as in the following equation (14). That is, in a case of calculating the temperature $T_h$ of the heater HT2 when the temperature $T_{FR}$ of the focus ring FR becomes a target temperature after transition to the steady state of the period T3 shown in FIG. 7, the equation (13) may be expressed as the following equation (14).

$$T_{FR} = T_h + q_p \cdot (R_{th} \cdot A + R_{thc} \cdot A) \tag{14}$$

For example, the temperature $T_{FR}$ of the focus ring FR may be obtained from the temperature $T_h$ of the heater, the heat flux $q_p$, and the thermal resistances $R_{th} \cdot A$ and $R_{thc} \cdot A$ by the equation (14).

Referring back to FIG. 3, the heater control unit 102a controls temperatures of the respective heaters HT. For example, the heater control unit 102a outputs, to the heater power supply HP, control data indicating a supply power to each heater HT to control the supply power supplied from the heater power supply HP to each heater HT, thereby controlling temperatures of the respective heaters HT.

At the time of the plasma processing, a target setting temperature of each heater HT is set in the heater control unit 102a. For example, a target temperature is set as the setting temperature of the heater HT for each division region 75 of the mounting region 18a in the heater control unit 102a. The target temperature may be a temperature at which the plasma etching accuracy is the best.

The heater control unit 102a controls the supply power to each heater HT such that each heater HT achieves the setting temperature at the time of the plasma processing. For example, the heater control unit 102a compares the temperature of each division region 75 of the mounting region 18a represented by the temperature data input to the external interface 101 with the setting temperature of the corresponding division region 75. This comparison is carried out for each division region 75. By using the comparison results, the heater control unit 102a specifies the division region 75 having a temperature lower than the setting temperature and the division region 75 having a temperature higher than the setting temperature. The heater control unit 102a outputs, to heater power supply HP, control data for increasing the supply power to the division region 75 having a temperature lower than the setting temperature and control data for reducing the supply power to the division region 75 having a temperature higher than the setting temperature.

The measurement unit 102b measures the supply power supplied to each heater HT. In the present embodiment, the measurement unit 102b measures the supply power to the heater HT2 by using the supply power to the heater HT2 represented by the power data input to the external interface 101. For example, the measurement unit 102b measures the supply power to the heater HT2 when the plasma processing is performed while the supply power to the heater HT2 is controlled by the heater control unit 102a such that the temperature of the heater HT2 is constant. For example, the measurement unit 102b measures the supply power to the heater HT2 in a non-ignition state where the plasma is not ignited before the start of the plasma processing. Further, the measurement unit 102b measures the supply power to the heater HT2 in a transient state before the tendency of the supply power to the heater HT2 to decrease stabilizes such that the supply power to the heater HT becomes constant after the plasma is ignited. Further, after the plasma is ignited, the measurement unit 102b measures the supply power to the heater HT2 in a steady state where the decrease of the supply power to the heater HT2 is stopped and the supply power to the heater HT2 becomes constant. The supply power to the heater HT2 in the non-ignition state may be measured at least once, or an average of values obtained by measuring several times may be set as the supply power in the non-ignition state. The supply power to the heater HT2 in the transient state and the steady state may be measured twice or more. Further, the timing of measuring the supply power may include the timing when the tendency of the supply power to decrease is large. Further, when the number of times of measurement is small, the measurement timing may be separated by a predetermined period of time. In the present embodiment, the measurement unit 102b measures the supply power to the heater HT2 at a predetermined time interval (e.g., at an interval of 0.1 second) during the plasma processing. Therefore, the supply power to the heater HT2 in the transient state and the steady state is measured several times.

The measurement unit 102b measures the supply power to the heater HT2 in the non-ignition state and the supply power to the heater HT2 in the transient state in a predetermined cycle. For example, when the plasma processing is performed after the focus ring FR is replaced and a wafer W and a new focus ring FR that have not been consumed are mounted on the mounting table 16, the measurement unit 102b measures the supply power to the heater HT2 in the non-ignition state and the supply power to the heater HT2 in the transient state. The measurement unit 102b measures the supply power to the heater HT2 in the non-ignition state and the supply power to the heater HT2 in the transient state whenever the wafer W is replaced and the replaced wafer W is mounted on the mounting table 16 to perform the plasma processing. Further, for example, the parameter calculation unit 102c may measure the supply power to the heater HT2 in the non-ignition state and the supply power to the heater HT2 in the transient state for each plasma processing.

The parameter calculation unit 102c calculates a heat input amount and a thermal resistance by using the supply power in the non-ignition state and the supply power in the transient state measured by the measurement unit 102b when a new focus ring FR is placed on the mounting table 16 and the plasma processing is performed.

First, the parameter calculation unit 102c calculates the heat generation amount of the heater HT2 for maintaining the temperature of the heater HT2 at a predetermined temperature in the non-ignition state. For example, the parameter calculation unit 102c calculates the heater power $P_{h0}$ in the non-ignition state from the supply power to the heater HT2 in the non-ignition state.

Further, the parameter calculation unit 102c calculates the thermal resistance between the focus ring FR and the mounting table 16 and the heat input amount flowing into the mounting table 16 from the plasma in the ignition state. For example, the parameter calculation unit 102c calculates the heat input amount and the thermal resistance by performing the fitting with a calculation model, which has the heat input amount and the thermal resistance as parameters and calculates the supply power in the transient state, by using the supply power in the non-ignition state and the supply power in the transient state.

For example, the parameter calculation unit 102c calculates the heater power $P_{h0}$ of the heater HT2 in the non-ignition state for each elapsed time t. Further, the parameter calculation unit 102c calculates the heater power $P_h$ of the heater HT2 in the transient state for each elapsed time t. The parameter calculation unit 102c calculates the heat generation amount $q_{h0}$ from the heater HT2 per unit area in the non-ignition state for each elapsed time t by dividing the calculated heater power $P_{h0}$ by an area A for the heater HT2. Further, the parameter calculation unit 102c calculates the heat generation amount $q_h$ from the heater HT2 per unit area in the transient state for each elapsed time t by dividing the calculated heater power $P_h$ by the area A for the heater HT2.

In addition, the parameter calculation unit 102c performs the fitting of the heat generation amount $q_h$ and the heat generation amount $q_{h0}$ for each elapsed time t by using the equations (1) to (11) as the calculation model, and calculates the heat flux $q_p$ and the thermal resistance $R_{th} \cdot A$ having the lowest degree of error. The thickness value of the new focus ring FR is used as the thickness $z_{FR}$ of the focus ring FR.

Further, the parameter calculation unit 102c may calculate the heat input amount from the plasma to the focus ring FR from the difference between the supply power in the non-ignition state and the supply power in the steady state. For example, the parameter calculation unit 102c may calculate the heat flux $q_p$ by dividing the difference between the heater power $P_{h0}$ in the non-ignition state and the heater power $P_h$ in the steady state by the area A of the heater HT2 by using the equation (12).

When the heat flux $q_p$ and the thermal resistance $R_{th} \cdot A$ during the plasma processing in the plasma processing apparatus 10 are given in advance by experiments or other methods, it is not necessary to calculate the heat flux $q_p$ and the thermal resistance $R_{th} \cdot A$.

Next, the parameter calculation unit 102c calculates the thickness $z_{FR}$ of the focus ring FR by using the supply power in the non-ignition state and the supply power in the transient state measured by the measurement unit 102b when the wafer W is replaced and the replaced wafer W is mounted on the mounting table 16 and the plasma processing is performed.

First, the parameter calculation unit 102c calculates the heat generation amount of the heater HT2 for maintaining the temperature of the heater HT2 at a predetermined temperature in the non-ignition state. For example, the parameter calculation unit 102c calculates the heater power $P_{h0}$ in the non-ignition state from the supply power to the heater HT2 in the non-ignition state.

Then, the parameter calculation unit 102c calculates the thickness $z_{FR}$ of the focus ring FR. For example, the parameter calculation unit 102c calculate the thickness $z_{FR}$ of the focus ring FR by performing the fitting with a calculation model, which has the thickness $z_{FR}$ of the focus ring FR as a parameter and calculates the supply power in the transient state, by using the supply power in the non-ignition state and the supply power in the transient state.

For example, the parameter calculation unit 102c calculates the heater power $P_{h0}$ of the heater HT2 in the non-ignition state for each elapsed time t. Further, the parameter calculation unit 102c calculates the heater power $P_h$ of the heater HT2 in the transient state for each elapsed time t. The parameter calculation unit 102c calculates the heat generation amount $q_{h0}$ from the heater HT2 per unit area in the non-ignition state for each elapsed time t by dividing the calculated heater power $P_{h0}$ by an area A for the heater HT2. Further, the parameter calculation unit 102c calculates the heat generation amount $q_h$ from the heater HT2 per unit area in the transient state for each elapsed time t by dividing the calculated heater power $P_h$ by the area A for the heater HT2.

In addition, the parameter calculation unit 102c performs the fitting of the thickness $z_{FR}$ of the focus ring FR by using the equations (1) to (11) as the calculation model, and calculates the thickness $z_{FR}$ of the focus ring FR having the lowest degree of error. The values of the heat flux $q_p$ and the thermal resistance $R_{th} \cdot A$ obtained by using the new focus ring FR are used as the heat flux $q_p$ and the thermal resistance $R_{th} \cdot A$. Alternatively, when the heat flux $q_p$ and the thermal resistance $R_{th} \cdot A$ are given in advance by experiments or other methods, the values of the given heat flux $q_p$ and the given thermal resistance $R_{th} \cdot A$ may be used.

As a result, the plasma processing apparatus 10 according to the present embodiment is capable of determining the thickness $z_{FR}$ of the consumed focus ring FR.

Here, when the plasma processing is continued, the focus ring FR is further consumed. For this reason, it is important for the plasma processing apparatus to check the thickness of the focus ring FR in a timely manner. However, since the focus ring FR is installed in the processing chamber 12, it is not possible to directly measure the thickness of the focus ring FR. Therefore, in the conventional plasma processing apparatus, the replacement time of the focus ring is determined based on the past results such as the number of processed wafers W or whether the focus ring should be replaced or not is determined by periodically processing the wafer W in which the etching characteristics on the outer peripheral portion of the wafer is monitored.

However, the plasma processing apparatus may perform the processings with different process recipes. For this reason, the plasma processing apparatus requires the use of a replacement time that gave a certain amount of margin to the past results and, thus, the productivity of the plasma processing apparatus decreases. Further, the periodic processing of the wafer that is monitored also decreases the productivity of the plasma processing apparatus.

Therefore, for example, it is conceivable to arrange sensors in the processing chamber 12 and measure the thickness of the focus ring FR with the sensors. However, when the sensors are disposed in the processing chamber 12, the manufacturing cost of the plasma processing apparatus 10 increases. Further, when the sensors are disposed in the processing chamber 12, the sensors become a singular point and deteriorate the uniformity of the plasma processing around the singular point. Therefore, it is desirable to obtain the thickness of the focus ring FR in the plasma processing apparatus without disposing the sensors in the processing chamber 12.

The plasma processing apparatus 10 according to the present embodiment can obtain the thickness of the focus ring FR without disposing the sensors in the processing chamber 12, and the degree of the consumption of the focus ring FR can be determined from the thickness of the focus ring FR. As described above, since the plasma processing apparatus 10 according to the present embodiment can obtain the thickness of the focus ring FR, it can be used as follows. For example, in a system in which a plurality of plasma processing apparatuses 10 are arranged to etch the wafer W, it is controlled such that the number of wafers W to be processed in the plasma processing apparatus 10 with a small consumption amount of the focus ring FR is increased to adjust the maintenance timing of the plasma processing apparatus 10. As a result, the maintenance downtime of the entire system can be shortened, and the productivity can be improved.

The setting temperature calculation unit 102d calculates a setting temperature of the heater HT2 at which the focus ring FR reaches a target temperature by using the calculated heat input amount, thermal resistance, and thickness $z_{FR}$ of the focus ring FR. For example, the setting temperature calculation unit 102d substitutes the calculated heat flux $q_p$, the calculated thermal resistance $R_{th} \cdot A$, and the calculated thickness $z_{FR}$ of the focus ring FR into the equations (5), (6), and (12) to obtain the values of $a_1$, $a_2$, $a_3$, $\lambda_1$, $\lambda_2$, $\tau_1$ and $\tau_2$ expressed in the equations (5) to (11). The setting temperature calculation unit 102d uses the obtained $a_1$, $a_2$, $a_3$, $\lambda_1$, $\lambda_2$, $\tau_1$ and $\tau_2$ to calculate the temperature $T_h$ of the heater HT2 at which the temperature $T_{FR}$ of the focus ring FR becomes the target temperature from the equation (12). For example, the setting temperature calculation unit 102d calculates the temperature $T_h$ of the heater HT2 at which the temperature $T_{FR}$ of the focus ring FR becomes the target temperature by setting the elapsed time t as a predetermined value large enough to be regarded as the steady state. The calculated temperature $T_h$ of the heater HT2 is the temperature of the heater HT2 that makes the temperature of the focus ring FR reach the target temperature. Further, the temperature $T_h$ of the heater HT2 at which the temperature of the focus ring FR becomes the target temperature may be obtained from the equation (13).

In addition, the setting temperature calculation unit 102d may calculate the temperature $T_{FR}$ of the focus ring FR at the current temperature $T_h$ of the heater HT2 from the equation (14). For example, the setting temperature calculation unit 102d calculates the temperature $T_{FR}$ of the focus ring FR at the current temperature $T_h$ of the heater HT2 when the elapsed time t is set to a predetermined value large enough to be regarded as the steady state. Next, the setting temperature calculation unit 102d calculates a difference $\Delta T_{FR}$ between the calculated temperature $T_{FR}$ and the target temperature. Then, the setting temperature calculation unit 102d may calculate the temperature obtained by subtracting the difference $\Delta T_{FR}$ from the current temperature $T_h$ of the heater HT2 as the temperature of the heater HT2 at which the temperature of the focus ring FR becomes the target temperature.

The setting temperature calculation unit 102d corrects the setting temperature of the heater HT2 set in the heater control unit 102a to the temperature of the heater HT2 that makes the temperature of the focus ring FR reach the target temperature.

Therefore, the plasma processing apparatus 10 according to the present embodiment may accurately control the temperature of the focus ring FR during the plasma processing to the target temperature.

The alarm unit 102e issues an alarm based on a change in the thickness $z_{FR}$ of the focus ring FR calculated in a predetermined cycle by the parameter calculation unit 102c. For example, the alarm unit 102e issues the alarm when the thickness $z_{FR}$ of the focus ring FR is equal to or smaller than a predetermined threshold indicating the replacement time. The alarm may be in any manner as long as the replacement time can be notified to a process manager, an operator of the plasma processing apparatus 10, or the like. For example, the alarm unit 102e displays a message notifying the replacement time on the user interface 103.

Accordingly, the plasma processing apparatus 10 according to the present embodiment may inform of the replacement time of the focus ring FR due to its consumption.

(Flow of Processing)

Figure 8:
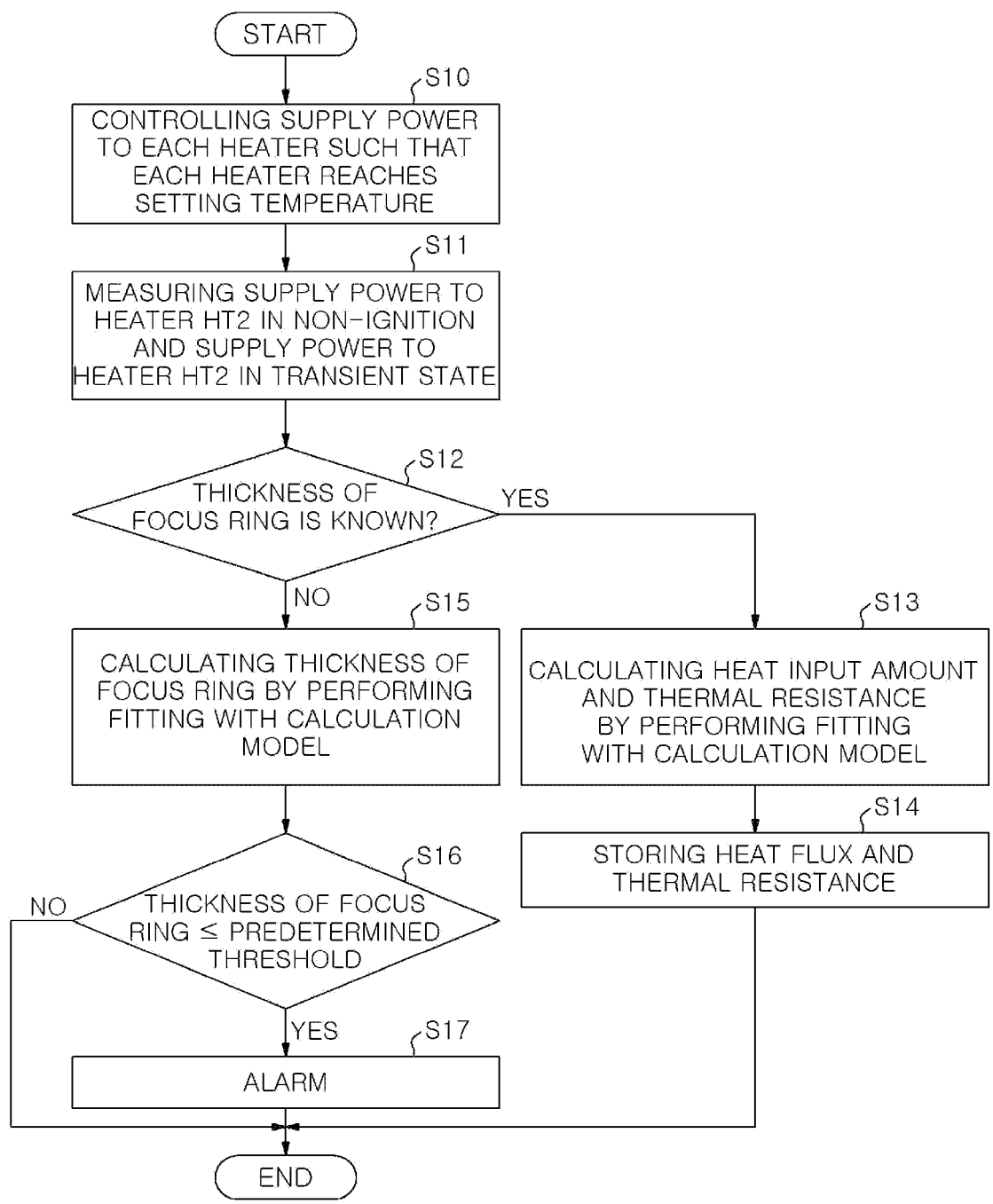
FIG. 8 is a flowchart showing an example of a flow of a determination process according to the first embodiment.

Next, a flow of a determination process that includes a calculation process in which the plasma processing apparatus 10 calculates the thickness of the focus ring FR, and determines the replacement time of the focus ring FR from the calculated thickness of the focus ring FR will be described. FIG. 8 is a flowchart showing an example of the flow of the determination process according to the first embodiment. This determination process is performed at a predetermined timing, e.g., at a timing when the plasma processing apparatus 10 starts the plasma processing.

The heater control unit 102a controls a supply power to each heater HT such that each heater HT reaches a setting temperature (step S10).

While the heater control unit 102a controls the supply power to each heater HT such that the temperature of each heater HT becomes a constant setting temperature, the measurement unit 102b measures the supply power to the heater HT2 in the non-ignition and the supply power to the heater HT2 in the transient state (step S11).

The parameter calculation unit 102c determines whether the thickness of the focus ring FR is known or not (step S12). For example, when the plasma processing is the initial plasma processing after the focus ring FR is replaced, if the focus ring FR is new, it is determined that the design dimensions are known and the thickness of the focus ring is also known. Further, when the replaced focus ring FR is the used focus ring FR, if the thickness of the focus ring FR is measured in advance with, e.g., a micrometer before the replacement, it is determined that the thickness of the focus ring FR is known. It is also preferred that whether or not the thickness of the focus ring FR is known may be input from the user interface 103, and the parameter calculation unit 102c determines whether or not the thickness of the focus ring FR is known using the input result. For example, the plasma processing apparatus 10 is configured such that the thickness of the focus ring FR may be input from the user interface 103. When the thickness of the focus ring FR is input from the user interface 103, the parameter calculation unit 102c may determine whether or not the thickness of the focus ring FR is known. Alternatively, the thickness value of the focus ring FR such as a new focus ring FR whose thickness is known may be stored in the storage unit 104, and then the thickness of the focus ring FR may be selectively input from the user interface 103.

When the thickness of the focus ring FR is known (YES in step S12), the parameter calculation unit 102c calculates a heat input amount and a thermal resistance by using the supply power in the non-ignition state and the supply power in the transient state measured by the measurement unit 102b (step S13). For example, the parameter calculation unit 102c performs the fitting of the heat generation amount $q_h$ and the heat generation amount $q_{h0}$ for each elapsed time t by using the equations (1) to (11) as the calculation model, and calculates the heat flux $q_p$ and the thermal resistance $R_{th} \cdot A$ having the lowest degree of error. The known thickness value of the focus ring FR is used as the thickness $z_{FR}$ of the focus ring FR.

The parameter calculation unit 102c stores the calculated heat flux $q_p$ and the calculated thermal resistance $R_{th} \cdot A$ in the storage unit 104 (step S14), and the process is terminated.

When the thickness of the focus ring FR is unknown (NO in step S12), the parameter calculation unit 102c calculates the thickness $z_{FR}$ of the focus ring FR by using the supply power in the non-ignition state and the supply power in the transient state measured by the measurement unit 102b (step S15). For example, the parameter calculation unit 102c performs the fitting of the thickness $z_{FR}$ of the focus ring FR by using the equations (1) to (11) as the calculation model, and calculates the thickness $z_{FR}$ of the focus ring FR having the lowest degree of error. As for the heat flux $q_p$ and the thermal resistance $R_{th} \cdot A$, the values stored in the storage unit 104 in step S14 are used, for example.

The alarm unit 102e determines whether the thickness $z_{FR}$ of the focus ring FR calculated by the parameter calculation unit 102c is equal to or smaller than the predetermined threshold (step S16). If it is determined that the thickness $z_{FR}$ of the focus ring FR is not equal to or smaller than the predetermined threshold (NO in step S16), the process is terminated.

On the other hand, if it is determined that the thickness $z_{FR}$ of the focus ring FR is equal to or smaller than the predetermined threshold (YES in step S16), the alarm unit 102e issues an alarm (step S17) and the process is terminated.

As described above, the plasma processing apparatus 10 according to the present embodiment includes the mounting table 16, the heater control unit 102a, the measurement unit 102b, and the parameter calculation unit 102c. The mounting table 16 includes the heater HT2 configured to adjust the temperature of the mounting surface on which the focus ring FR that is consumed by the plasma processing is mounted. The heater control unit 102a controls the supply power supplied to the heater HT2 such that the temperature of the heater HT2 becomes a setting temperature. While the heater control unit 102a controls the supply power to the heater HT2 such that the temperature of the heater HT2 becomes constant, the measurement unit 102b measures the supply power in the non-ignition state where the plasma is not ignited and the supply power in the transient state where the supply power to the heater HT2 is decreased after the plasma is ignited. The parameter calculation unit 102c calculates the thickness $z_{FR}$ of the focus ring FR by performing the fitting of the thickness $z_{FR}$ of the focus ring FR with the calculation model, which has the thickness $z_{FR}$ of the focus ring FR as a parameter and calculates the supply power in the transient state, by using the supply power in the non-ignition state and the supply power in the transient state measured by the measurement unit 102b. As a result, the plasma processing apparatus 10 determines the thickness of the focus ring FR and further determine the degree of consumption of the focus ring FR from the thickness of the focus ring FR.

Moreover, the measurement unit 102b measures the supply power in the non-ignition state and the supply power in the transient state in a predetermined cycle. The parameter calculation unit 102c calculates the thickness $z_{FR}$ of the focus ring FR by using the supply power in the non-ignition state and the supply power in transient supply power measured in each predetermined cycle. The alarm unit 102e issues the alarm based on the change in the thickness $z_{FR}$ of the focus ring FR calculated by the parameter calculation unit 102c. Accordingly, the plasma processing apparatus 10 can notify the replacement time due to the consumption of the focus ring FR.

Second Embodiment

Figure 9:
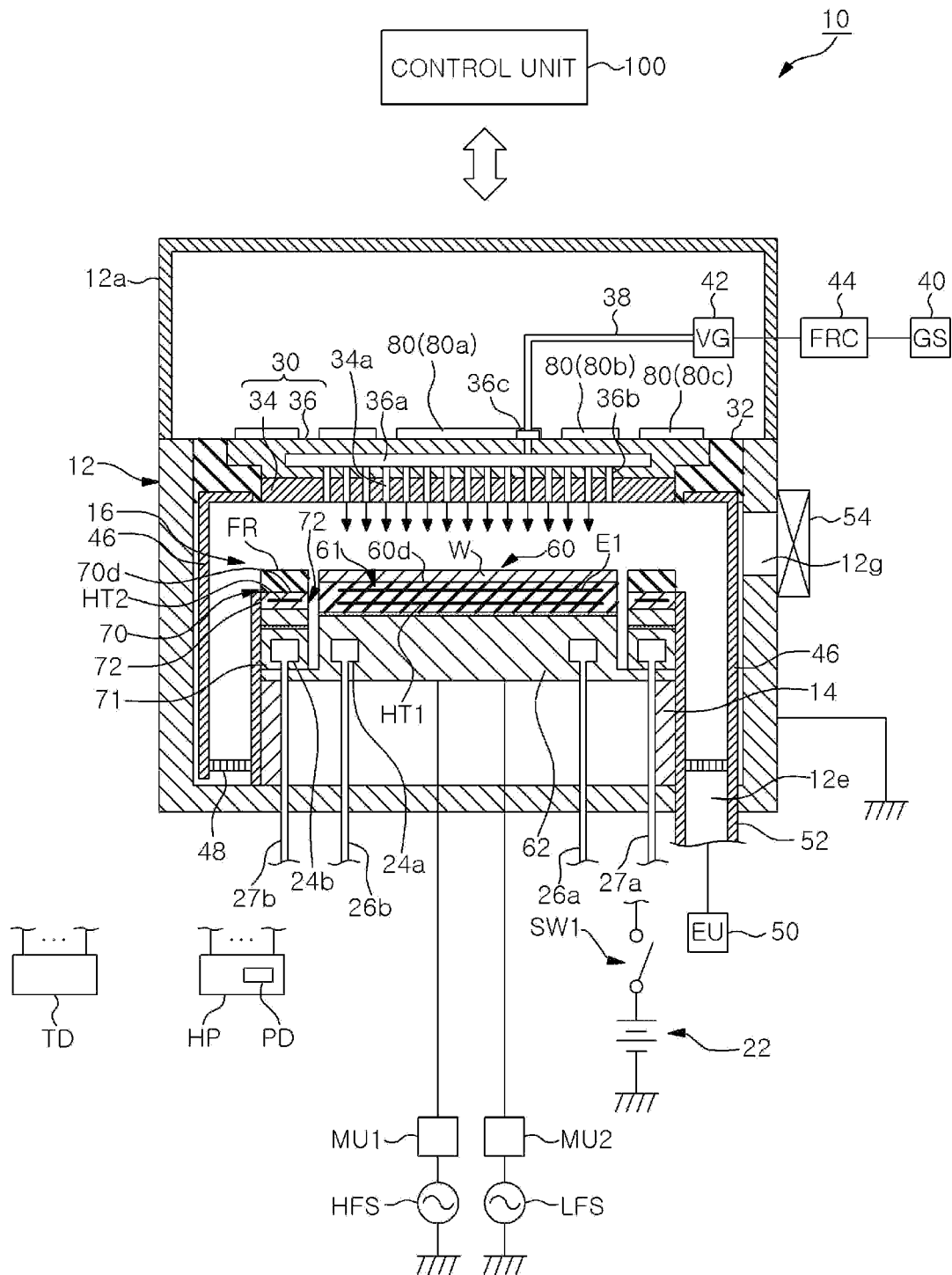
FIG. 9 is a cross-sectional view showing an example of a schematic configuration of a plasma processing apparatus according to a second embodiment.

Next, a schematic configuration of the plasma processing apparatus 10 according to a second embodiment will be described. FIG. 9 is a cross-sectional view showing an example of a schematic configuration of a plasma processing apparatus according to the second embodiment. A configuration of the plasma processing apparatus 10 according to the second embodiment is basically the same as that of the plasma processing apparatus 10 according to the first embodiment shown in FIG. 1. Therefore, the difference therebetween is mainly described hereinafter, and like reference numerals will be given to like parts and redundant description thereof will be omitted.

The mounting table 16 according to the second embodiment is divided into a first mounting table 60 that supports the wafer W and a second mounting table 70 that supports the focus ring FR.

The first mounting table 60 has a substantially cylindrical shape with upper and lower surfaces directed vertically. An upper surface of the first mounting table 60 serves as a mounting surface 60d on which the wafer W is mounted. The mounting surface 60d of the first mounting table 60 has substantially the same size as the wafer W. The first mounting table 60 includes an electrostatic chuck 61 and a base 62.

The base 62 is made of a conductive metal, e.g., aluminum having an anodically oxidized surface or the like. The base 62 serves as a lower electrode. The base 62 is supported by the supporting member 14 made of an insulator.

The electrostatic chuck 61 has a flat disc-shaped upper surface serving as the mounting surface 60d on which the wafer W is mounted. The electrostatic chuck 61 is provided at a central portion of the first mounting table 60 when seen from the top. The electrostatic chuck 61 includes an electrode μl. The electrostatic chuck 61 further includes the heater HT1.

A second mounting table 70 is provided to surround an outer peripheral surface of the first mounting table 60. The second mounting table 70 is formed in a cylindrical shape whose inner diameter is greater than an outer diameter of the first mounting table 60 by a predetermined value. The first mounting table 60 and the second mounting table 70 are coaxially arranged. The second mounting table 70 has an upper surface serving as a mounting surface 70d on which the focus ring FR is mounted.

The second mounting table 70 includes a base 71 and a focus ring heater unit 72. The base 71 is made of a conductive metal similar to that of the base 62. The base 71 is made of, e.g., aluminum having an anodically oxidized surface or the like. A lower portion of the base 62 is greater in a diametrical direction than an upper portion of the base 62 and extends in a flat plate shape up to a position of the lower part of the second mounting table 70. The base 71 is supported by the base 62. The focus ring heater unit 72 is supported by the base 71. The focus ring heater unit 72 has an annular shape with a flat upper surface serving as a mounting surface 70d on which the focus ring FR is mounted. The focus ring heater unit 72 includes the heater HT2.

A coolant channel 24a is formed in the base 62. The coolant is supplied to the coolant channel 24a from the chiller unit through the line 26a. The coolant supplied to the coolant channel 24a returns to the chiller unit through a line 26b. Further, a coolant channel 24b is formed in the base 71. The coolant is supplied to the coolant channel 24b from the chiller unit through a line 27a. The coolant supplied to the coolant channel 24b returns to the chiller unit through a line 27b. The coolant channel 24a is positioned below the wafer W and absorbs heat of the wafer W. The coolant channel 24b is positioned below the focus ring FR and absorbs heat of the focus ring FR.

Further, the upper electrode 30 is provided above the first mounting table 60 to face the first mounting table 60 in parallel therewith. The upper electrode 30 has a plurality of electromagnets 80 arranged on an upper surface of the upper electrode 30. In the present embodiment, three electromagnets 80a to 80c are arranged on the upper surface of the upper electrode 30. The electromagnet 80a has a disc shape and is arranged on the upper surface of the upper electrode 30 that corresponds to the central portion of the first mounting table 60. The electromagnet 80b has an annular shape to surround the electromagnet 80a and is arranged on the upper surface of the upper electrode 30 that corresponds to an outer peripheral portion of the first mounting table 60. The electromagnet 80c has an annular shape has a size greater than the electromagnet 80b to surround the electromagnet 80b and is arranged on the upper surface of the upper electrode 30 that corresponds to the second mounting table 70.

The electromagnets 80a to 80c are individually connected to a power supply (not shown) and individually generate magnetic fields by powers supplied from the power supply. The power supplied from the power supply to each of the electromagnets 80a to 80c is controlled by the control unit 100. The control unit 100 controls the power supply to control the power supplied to each of the electromagnets 80a to 80c, and thus the magnetic field generated from each of the electromagnets 80a to 80c can be controlled.

(Configuration of Control Unit)

Figure 10:
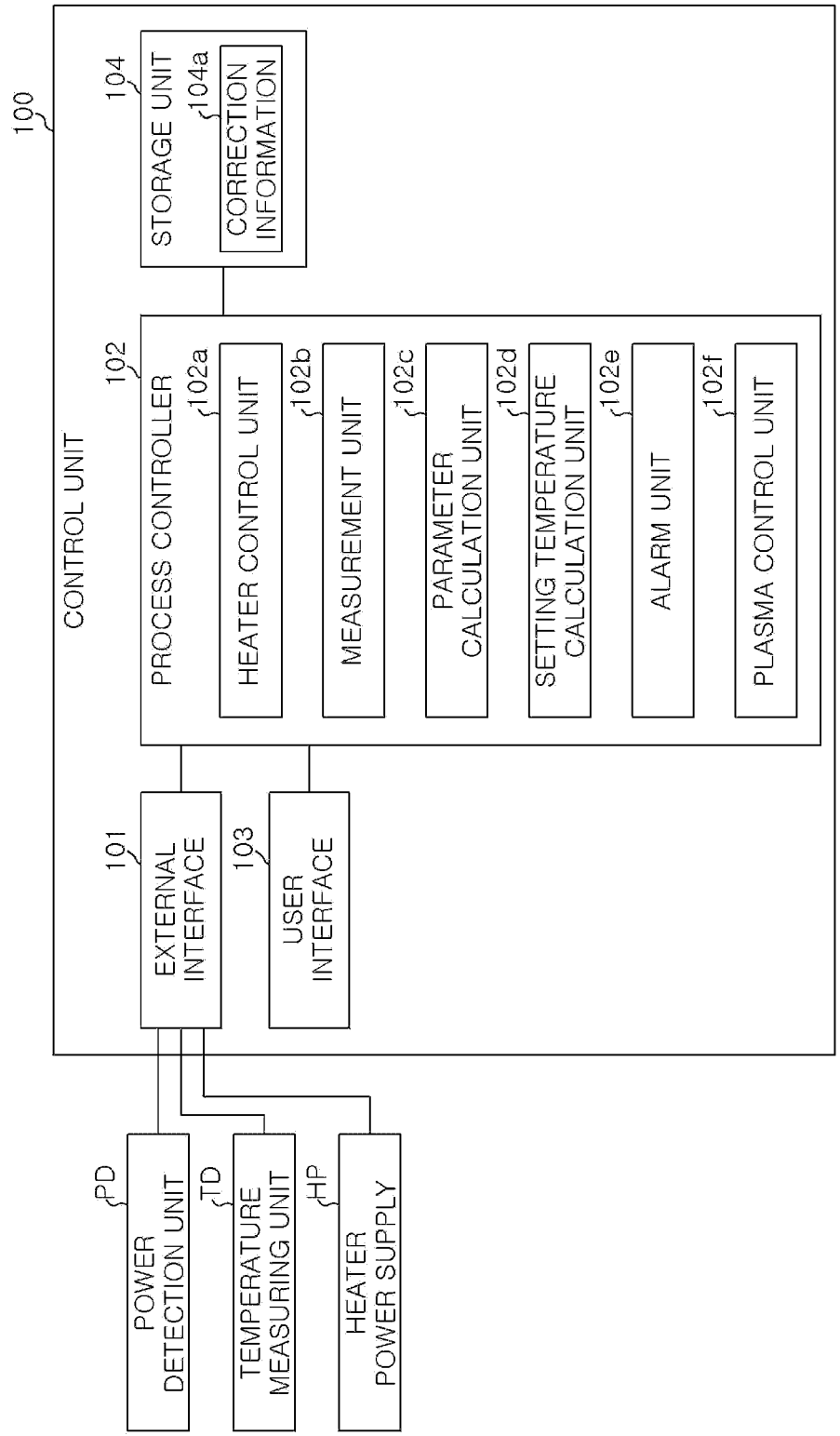
FIG. 10 is a block diagram showing an example of a schematic configuration of a control unit that controls the plasma processing apparatus according to the second embodiment.

Next, the control unit 100 will be described in detail. FIG. 10 is a block diagram showing an example of a schematic configuration of the control unit that controls the plasma processing apparatus according to the second embodiment. A configuration of the control unit 100 according to the second embodiment is basically the same as that of the control unit 100 according to the first embodiment shown in FIG. 3. Therefore, the difference therebetween is mainly described hereinafter, and like reference numerals will be given to like parts and redundant description thereof will be omitted.

The storage unit 104 stores therein correction information 104a. Further, the correction information 104a may be stored in a computer-readable storage medium (e.g., a hard disk, an optical disk such as a DVD, a flexible disk, a semiconductor memory, or the like). Alternatively, the correction information 104a may be stored in another device and may be read and used online through, e.g., a dedicated line.

The correction information 104a is data in which various types of information used for correcting the plasma processing conditions are stored. Details of the correction information 104a will be described later.

The process controller 102 further has a function of a plasma control unit 102f.

In the plasma processing apparatus 10, the plasma is generated in the processing chamber 12 when the etching is performed. However, a height of a plasma sheath is changed due to the consumption of the focus ring FR, and thus the etching characteristics are changed.

Figure 11:
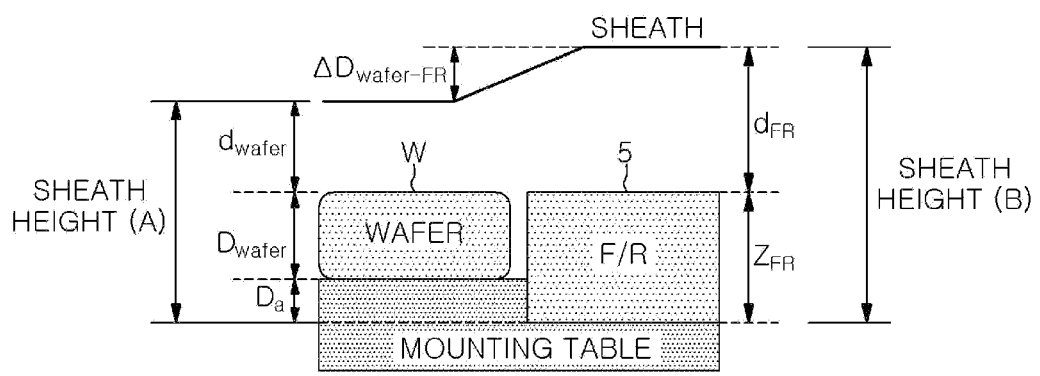
FIG. 11 is a diagram schematically showing an example of a state of a plasma sheath.

FIG. 11 schematically shows an example of a state of the plasma sheath. FIG. 11 shows the wafer W and the focus ring FR placed on the mounting table. The mounting table shown in FIG. 11 is a combination of the first mounting table 60 and the second mounting table 70. $D_{wafer}$ is a thickness of the wafer W. $d_{wafer}$ is a height from an upper surface of the wafer W to a plasma sheath interface above the wafer W. A thickness $D_a$ is a difference in height between a mounting surface of the mounting table on which the wafer W is mounted and a mounting surface of the mounting table on which the focus ring FR is mounted. For example, in the second embodiment, the thickness $D_a$ is a height difference between the mounting surface 60d of the first mounting table 60 and the mounting surface 70d of the second mounting table 70. The thickness $D_a$ is determined as a fixed value depending on the configuration of the first mounting table 60 and the second mounting table 70. The thickness $z_{FR}$ is the thickness of the focus ring FR. A thickness $d_{FR}$ is a height from an upper surface of the focus ring FR to a plasma sheath interface above the focus ring FR.

A height difference $\Delta D_{wafer-FR}$ between the plasma sheath interface above the wafer W and the plasma sheath interface above the focus ring FR can be expressed by the following equation (15).

$$\Delta D_{wafer-FR} = (D_a + D_{wafer} + d_{wafer}) - (z_{FR} + d_{FR}) \quad (15)$$

For example, when the thickness $z_{FR}$ of the focus ring FR becomes thinner due to the consumption of the focus ring FR, the height difference $D_{wafer-FR}$ is changed. For this reason, in the plasma processing apparatus 10, the etching characteristics are changed.

Figure 12A:
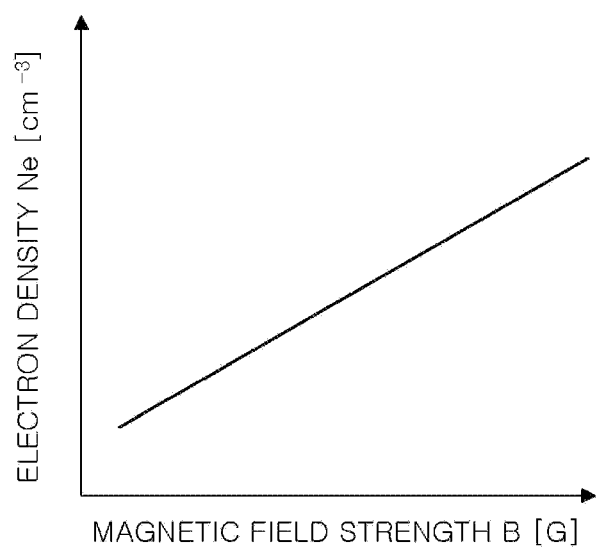
FIG. 12A is a graph showing an example of a relationship between magnetic field strength and plasma electron density.

However, in the plasma processing apparatus 10, the plasma state is changed due to the magnetic forces from the electromagnets 80a to 80c. FIG. 12A is a graph showing an example of a relationship between magnetic field strength and plasma electron density. As shown in FIG. 12A, there is a proportional relationship between the magnetic field strength of the magnetic force applied to the plasma and the plasma electron density.

The plasma electron density and a thickness of the plasma sheath have a relationship of the following equation (16).

$$\text{Sheath thickness} = \frac{\sqrt{2}}{3}\left(\frac{\varepsilon_0 T_e}{e \cdot N_e}\right)\left(\frac{2V_{dc}}{T_e}\right)^{3/4} \quad (16)$$

Here, $N_e$ is the plasma electron density. $T_e$ is a plasma electron temperature [eV]. $V_{dc}$ is a potential difference with the plasma. $V_{dc}$ is a potential difference between the plasma and the wafer W in the case of plasma above the wafer W and is a potential difference between the plasma and the focus ring FR in the case of plasma on the focus ring FR.

Figure 12B:
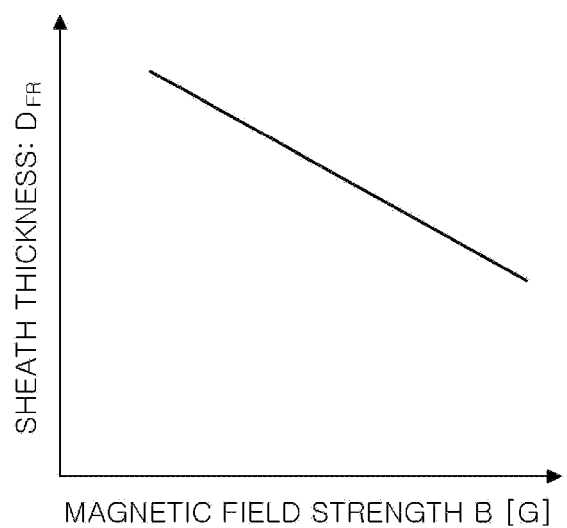
FIG. 12B is a graph showing an example of the relationship between the magnetic field strength and a thickness of the plasma sheath.

As shown in the equation (16), the thickness of the plasma sheath is inversely proportional to the electron density $N_e$. Therefore, there is an inversely proportional relationship between the magnetic field strength of the magnetic force applied to the plasma and the plasma electron density. FIG. 12B is a graph showing an example of the relationship between the magnetic field strength and the thickness of the plasma sheath. As shown in FIG. 12B, the thickness of the plasma sheath is inversely proportional to the magnetic field strength of the magnetic force applied to the plasma.

Therefore, in the plasma processing apparatus 10 according to the second embodiment, the magnetic field strength of the magnetic force generated from each of the electromagnets 80a to 80c is controlled in order to suppress the change in the etching characteristics due to the consumption of the focus ring FR.

Referring back to FIG. 10, the correction information 104a according to the second embodiment stores a correction value for the power supplied to each of the electromagnets 80a to 80c for each thickness of the focus ring FR. For example, the amount of power of each of the electromagnets 80a to 80c, at which the magnetic field strength that allows the height difference $\Delta D_{wafer-FR}$ between the plasma sheath interface above the wafer W and the plasma sheath interface above the focus ring FR to be within a predetermined range can be obtained, is experimentally measured. For example, when AC power is supplied from the power supply to the electromagnet 80, one of AC voltage, AC frequency and AC power is changed and the changed AC voltage, the changed AC frequency or the changed AC power is measured as the amount of power. When DC power is supplied from the power supply to the electromagnet 80, either DC voltage or DC current amount is changed and the changed DC voltage or the changed DC current amount is measured as the amount of power. The predetermined range is, e.g., a range of $\Delta D_{wafer\text{-}FR}$ in which a hole angle θ, when the wafer W is etched, is within an allowable accuracy.

Based on the measurement result, for each thickness of the focus ring FR, the correction value of the power supplied to each of the electromagnets 80a to 80c that allows the height difference $\Delta D_{wafer\text{-}FR}$ to be within the predetermined range is stored in the correction information 104a. The correction value may be a value of the amount of power itself at which the difference $\Delta D_{wafer\text{-}FR}$ is within the predetermined range, or may be a difference value with respect to the standard amount of power that is supplied to each of the electromagnets 80a to 80c during the plasma processing. In the present embodiment, the correction value is the value of the amount of power supplied to each of the electromagnets 80a to 80c itself.

Here, in the case where the plasma processing apparatus according to the second embodiment corrects the power supplied to the electromagnet 80c to correct the height of the interface of the plasma sheath formed above the focus ring FR will be described. The correction information 104a includes the correction value of the supply power to the electromagnet 80c for each thickness of the focus ring FR. Alternatively, the plasma processing apparatus 10 may correct the power supplied to each of the electromagnets 80a and 80b to correct the height of the interface of the plasma sheath formed above the wafer W. In this case, the correction information 104a includes a correction value for the supply power to each of the electromagnets 80a and 80b for each thickness of the focus ring FR. Further alternatively, the plasma processing apparatus 10 may correct the power supplied to each of the electromagnets 80a to 80c to correct the height of the interface of the plasma sheath formed above the focus ring FR and the height of the interface of the plasma sheath formed above the wafer W. In this case, the correction information 104a includes a correction value for the supply power to each of the electromagnets 80a to 80c for each thickness of the focus ring FR.

The plasma control unit 102f controls the plasma processing such that the height difference $\Delta D_{wafer\text{-}FR}$ between the plasma sheath interface above the wafer W and the plasma sheath interface above the focus ring FR is within the predetermined range.

The plasma control unit 102f controls the magnetic force of each of the electromagnets 80a to 80c based on the thickness $z_{FR}$ of the focus ring FR calculated by the parameter calculation unit 102c. For example, the plasma control unit 102f reads, from the correction information 104a, the correction value of the power supplied to each of the electromagnets 80a to 80c corresponding to the thickness $z_{FR}$ of the focus ring FR. Then, the plasma control unit 102f controls the power supply connected to the electromagnets 80a to 80c so that the supply powers corresponding to the read correction values are supplied to the electromagnets 80a to 80c, respectively, during the plasma processing. In the present embodiment, the plasma control unit 102f controls the power supply connected to the electromagnet 80c so that the supply power corresponding to the correction value is supplied to the electromagnet 80c.

As a result, in the plasma processing apparatus 10, the height difference $\Delta D_{wafer\text{-}FR}$ between the plasma sheath interface above the wafer W and the plasma sheath interface above the focus ring FR becomes within the predetermined range. Accordingly, in the plasma processing apparatus 10, the change in the etching characteristics due to the consumption of the focus ring FR can be suppressed.

Figure 13:
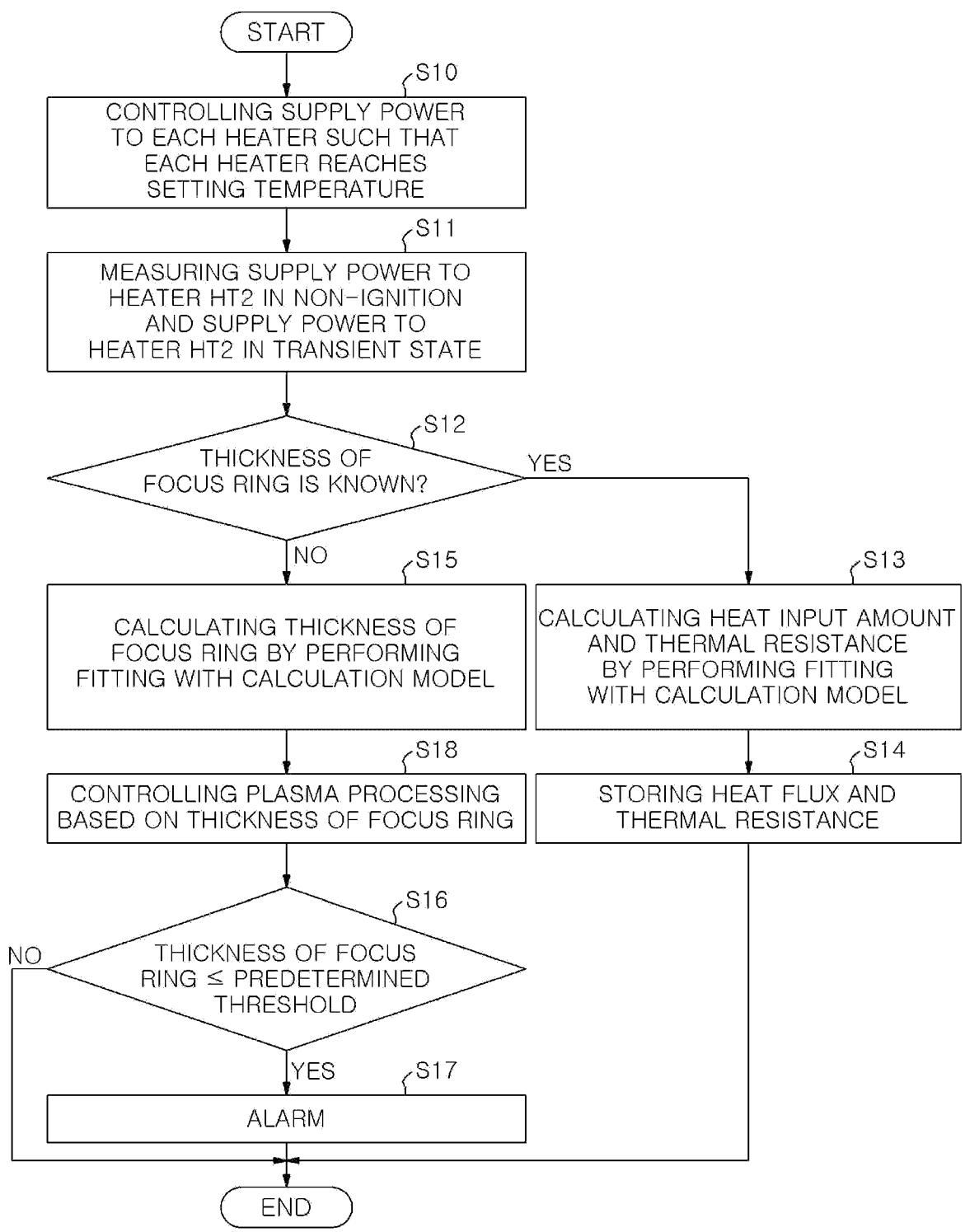
FIG. 13 is a flowchart showing an example of a flow of determination process according to the second embodiment.

Next, a plasma control process using the plasma processing apparatus 10 according to the second embodiment will be described. FIG. 13 is a flowchart showing an example of the flow of determination process according to the second embodiment. The determination process according to the second embodiment is basically the same as the determination process according to the first embodiment shown in FIG. 8. Therefore, the difference therebetween is mainly described hereinafter, and like reference numerals will be given to like parts and redundant description thereof will be omitted.

The plasma control unit 102f controls the plasma processing based on the thickness $z_{FR}$ of the focus ring FR calculated by the parameter calculation unit 102c (step S18). For example, the plasma control unit 102f controls the magnetic forces of the electromagnets 80a to 80c to allow the height difference $\Delta D_{wafer\text{-}FR}$ between the plasma sheath interface above the wafer W and the plasma sheath interface above the focus ring FR to be within a predetermined range based on the thickness $z_{FR}$ of the focus ring FR.

As described above, the plasma processing apparatus 10 according to the second embodiment further includes the plasma control unit 102f. Based on the thickness $z_{FR}$ of the focus ring FR, the plasma control unit 102f controls the plasma processing to allow the height difference between the interface of the plasma sheath formed above the wafer W and the interface of the plasma sheath formed above the focus ring FR to be within the predetermined range. Accordingly, the plasma processing apparatus 10 can suppress the differences in the etching characteristics of the wafers W.

The plasma processing apparatus 10 according to the second embodiment further includes at least one electromagnet 80 arranged in parallel with at least one of the wafer W or the focus ring FR. The plasma control unit 102f controls the supply power to the electromagnet 80 based on the thickness $z_{FR}$ of the focus ring FR, so that the magnetic force of the electromagnet 80 is controlled to allow the height difference between the interface of the plasma sheath formed above the wafer W and the interface of the plasma sheath formed above the focus ring FR to be within the predetermined range. Therefore, the plasma processing apparatus 10 can suppress the differences in the etching characteristics of the wafers W.

In the determination process according to the second embodiment shown in FIG. 13, the case where step S18 is executed after step S15 has been described as an example. However, the present disclosure is not limited thereto. For example, step S18 may be executed consecutively during the plasma processing on the wafer W used in step S15. Further, step S18 may be executed during the plasma processing on and after the next wafer W after the plasma processing on the wafer W used in step S15 is completed.

When step S18 is continuously executed during the plasma processing on the wafer W used in step S15, the plasma control unit 102f controls the magnetic forces of the electromagnets 80a to 80c in the period T3 shown in FIG. 7.

When step S18 is executed during the plasma processing on and after the next wafer W after the plasma processing on the wafer W used in step S15 is completed, the plasma control unit 102f controls the magnetic forces of the electromagnets 80a to 80c from the time period of the plasma ignition. When the magnetic forces of the electromagnets 80a to 80c are changed from the initial setting values, the electron density of the plasma increases or decreases as shown in FIG. 12A, so that the heat input amount from the plasma to the focus ring FR also increases or decreases. In this case, it is desirable that the thickness $z_{FR}$ of the focus ring FR calculated in step 15 is set as the known thickness of the focus ring FR, and the heat flux $q_p$ from the plasma and the thermal resistance $R_{th} \cdot A$ with the magnetic forces of the controlled electromagnets 80a to 80c are calculated by executing steps S13 and S14 again. Then, the calculated heat flux $q_p$ and the calculated thermal resistance $R_{th} \cdot A$ are stored in the storage unit 104 as a new heat flux $q_p$ and a new thermal resistance $R_{th} \cdot A$.

Further, in the determination process according to the second embodiment shown in FIG. 13, the case where step S18 is executed between step S15 and step S16 has been described as an example. However, the present disclosure is not limited thereto. For example, step S18 may be executed after "NO" in step 16, that is, when it is determined that the thickness $z_{FR}$ of the focus ring FR is not equal to or smaller than the predetermined threshold. Therefore, it is possible to minimize the deterioration of reproducibility caused when the plasma processing on the wafer W is performed even when the thickness $z_{FR}$ of the focus ring FR is determined to be equal to or less than the predetermined threshold.

Third Embodiment

Figure 14:
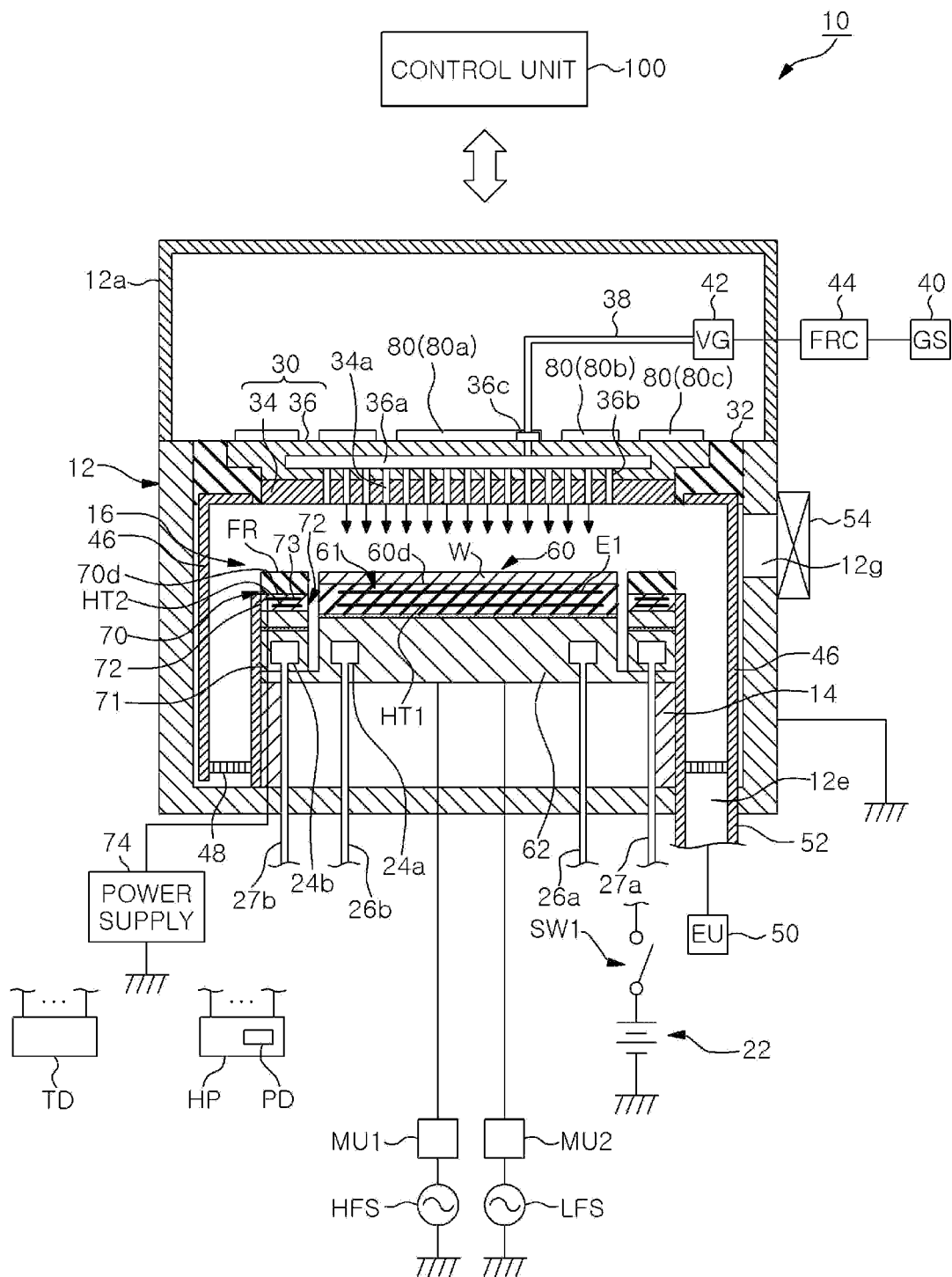
FIG. 14 is a cross-sectional view showing an example of a schematic configuration of a plasma processing apparatus according to a third embodiment.

Next, a third embodiment will be described. FIG. 14 is a cross-sectional view showing an example of a schematic configuration of a plasma processing apparatus according to a third embodiment. A configuration of the plasma processing apparatus 10 according to the third embodiment is basically the same as that of the plasma processing apparatus 10 according to the second embodiment shown in FIG. 9. Therefore, the difference therebetween is mainly described hereinafter, and like reference numerals will be given to like parts and redundant description thereof will be omitted.

In the second mounting table 70 according to the third embodiment, an electrode is additionally provided at the mounting surface 70d on which the focus ring FR is mounted. For example, in the second mounting table 70, an electrode 73 is additionally provided in the focus ring heater unit 72 to extend along the entire circumference of the focus ring heater unit 72. The electrode 73 is electrically connected to a power supply 74 through wiring. The power supply 74 according to the third embodiment is a DC power supply and applies a DC voltage to the electrode 73.

The plasma state is changed due to the changes in the electrical characteristics of the surroundings of the plasma. For example, the state of the plasma above the focus ring FR changes depending on the magnitude of the DC voltage applied to the electrode 73, which leads to the change in the thickness of the plasma sheath.

Therefore, in the plasma processing apparatus 10 according to the third embodiment, the DC voltage applied to the electrode 73 is controlled to suppress the change in the etching characteristics due to the consumption of the focus ring FR.

The correction information 104a according to the third embodiment stores a correction value for the DC voltage applied to the electrode 73 for each thickness of the focus ring FR. For example, the DC voltage applied to the electrode 73 that allows the height difference $\Delta D_{wafer-FR}$ between the plasma sheath interface above the wafer W and the plasma sheath interface above the focus ring FR to be within a predetermined range is experimentally measured. Based on the measurement results, for each thickness of the focus ring FR, the correction value of the DC voltage applied to the electrode 73 that allows the height difference $\Delta D_{wafer-FR}$ to be within the predetermined range is stored in the correction information 104a. The correction value may be a value of the DC voltage at which the difference $\Delta D_{wafer-FR}$ is within the predetermined range, or may be a difference value with respect to the standard DC voltage applied to the electrode 73 during the plasma processing. In the present embodiment, the correction value is the value of the DC voltage applied to the electrode 73 itself.

The plasma control unit 102f controls the DC voltage applied to the electrode 73 based on the thickness $z_{FR}$ of the focus ring FR calculated by the parameter calculation unit 102c. For example, the plasma control unit 102f reads, from the correction information 104a, the correction value of the DC voltage applied to the electrode 73 corresponding to the thickness $z_{FR}$ of the focus ring FR. Then, the plasma control unit 102f controls the power supply 74 so that the DC voltage corresponding to the read correction value is applied to the electrode 73 during the plasma processing.

As a result, in the plasma processing apparatus 10, the height difference $\Delta D_{wafer-FR}$ between the plasma sheath interface above the wafer W and the plasma sheath interface above the focus ring FR becomes within the predetermined range. Accordingly, in the plasma processing apparatus 10, the change in the etching characteristics due to the consumption of the focus ring FR can be suppressed.

As described above, the plasma processing apparatus 10 according to the third embodiment further includes the electrode 73 that is provided at the mounting surface 70d on which the focus ring FR is mounted and to which a DC voltage is applied. Based on the thickness $z_{FR}$ of the focus ring FR, the plasma control unit 102f controls the DC voltage applied to the electrode 73 to allow the height difference between the interface of the plasma sheath formed above the wafer W and the interface of the plasma sheath formed above the focus ring FR to be within the predetermined range. Accordingly, the plasma processing apparatus 10 can suppress the differences in the etching characteristics of the wafers W.

Fourth Embodiment

Figure 15:
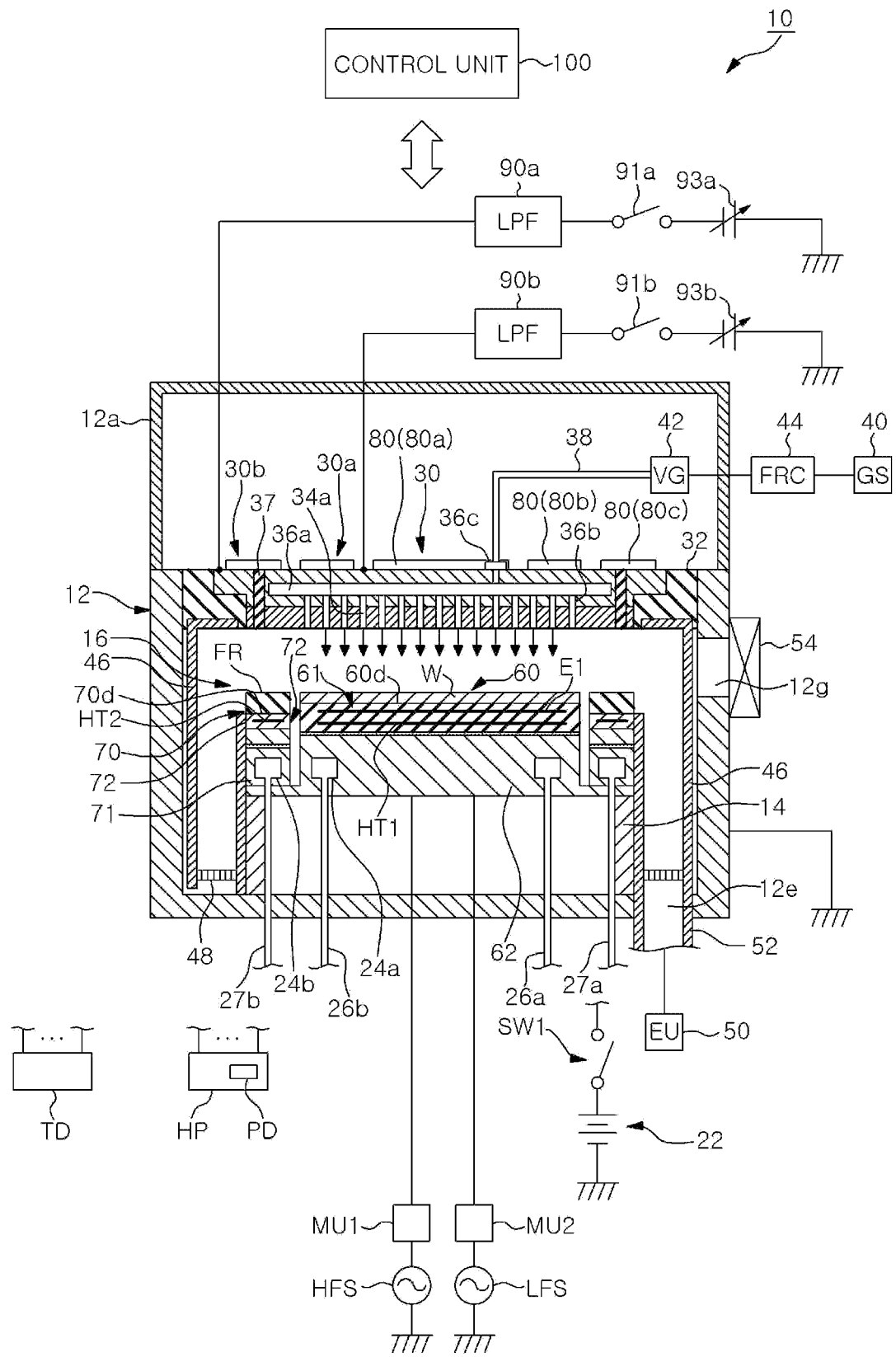
FIG. 15 is a cross-sectional view showing an example of a schematic configuration of a plasma processing apparatus according to a fourth embodiment.

Next, a fourth embodiment will be described. FIG. 15 is a cross-sectional view showing an example of a schematic configuration of a plasma processing apparatus according to a fourth embodiment. A configuration of the plasma processing apparatus 10 according to the fourth embodiment is basically the same as that of the plasma processing apparatus 10 according to the second embodiment shown in FIG. 9. Therefore, the difference therebetween is mainly described hereinafter, and like reference numerals will be given to like parts and redundant description thereof will be omitted.

Each of the electrode plate 34 and the electrode support 36 of the upper electrode 30 according to the fourth embodiment is divided into a plurality of portions by an insulating member. For example, each of the electrode support 36 and the electrode plate 34 is divided into a central portion 30a and a peripheral portion 30b by an annular insulating member 37. The central portion 30a is formed in a disc shape and is arranged above the central portion of the first mounting table 60. The peripheral portion 30b is formed in an annular shape to surround the central portion 30a and is arranged above the outer peripheral portion of the first mounting table 60.

In the upper electrode 30 according to the fourth embodiment, DC currents can be individually applied to the divided portions, and each of the divided portions serve as the upper electrode. For example, a variable DC power supply 93a is electrically connected to the peripheral portion 30b through a low-pass filter (LPF) 90a and an on/off switch 91a. A variable DC power supply 93b is electrically connected to the central portion 30a through a low-pass filter (LPF) 90b and an on/off switch 91b. The power respectively applied by the variable DC power supplies 93a and 93b to the central portion 30a and the peripheral portion 30b can be controlled by the control unit 100. The central portion 30a and the peripheral portion 30b serve as electrodes.

The plasma state is changed due to the changes in the electrical characteristics of the surroundings of the plasma. For example, in the plasma processing apparatus 10, the plasma state changes depending on the magnitudes of the voltages applied to the central portion 30a and the peripheral portion 30b, respectively.

Therefore, in the plasma processing apparatus 10 according to the fourth embodiment, the voltages applied to the central portion 30a and the peripheral portion 30b are controlled to suppress the changes in the etching characteristics due to consumption of the focus ring FR.

The correction information 104a according to the fourth embodiment stores a correction value of the DC voltage applied to each of the central portion 30a and the peripheral portion 30b for each thickness of the focus ring FR. For example, the DC voltages respectively applied to the central portion 30a and the peripheral portion 30b that allow the height difference $\Delta D_{wafer-FR}$ between the plasma sheath interface above the wafer W and the plasma sheath interface above the focus ring FR to be within a predetermined range is experimentally measured. Based on the measurement result, for each thickness of the focus ring FR, the correction values of the DC voltages respectively applied to the central portion 30a and the peripheral portion 30b that allow the difference $\Delta D_{wafer-FR}$ to be within the predetermined range is stored in the correction information 104a. The correction values may be values of the DC voltages applied to the central portion 30a and the peripheral portion 30b themselves, or a difference value with respect to the standard DC voltage applied to each of the central portion 30a and the peripheral portion 30b during the plasma processing. In the present embodiment, the correction value is the value of the DC voltage applied to each of the central portion 30a and the peripheral portion 30b.

Here, the case where the plasma processing apparatus 10 according to the fourth embodiment corrects the height of the interface of the plasma sheath formed above the focus ring FR by correcting the DC voltage applied to the peripheral portion 30b is described. In the correction information 104a, the correction value for the DC voltage applied to the peripheral portion 30b is stored for each thickness of the focus ring FR. The plasma processing apparatus 10 may further divide the upper electrode 30 into multiple annular shaped portions and correct the DC voltage applied to each of the multiple annular shaped portions to correct the height of the interface of the plasma sheath formed above the wafer W.

The plasma control unit 102f controls the DC voltage applied to the peripheral portion 30b based on the thickness $z_{FR}$ of the focus ring FR calculated by the parameter calculation unit 102c. For example, the plasma control unit 102f reads, from the correction information 104a, the correction value of the DC voltage applied to the peripheral portion 30b corresponding to the thickness $z_{FR}$ of the focus ring FR. Then, the plasma control unit 102f controls the variable DC power supply 93a so that the DC voltage having the read correction value is supplied to the peripheral portion 30b during the plasma processing.

As a result, in the plasma processing apparatus 10, the height difference $\Delta D_{wafer-FR}$ between the plasma sheath interface above the wafer W and the plasma sheath interface above the focus ring FR becomes within the predetermined range. Accordingly, in the plasma processing apparatus 10, the changes in the etching characteristics due to the consumption of the focus ring FR can be suppressed.

As described above, the upper electrode (gas supply unit) 30 according to the fourth embodiment is disposed to face the wafer W and the focus ring FR to inject processing gas and has the central portion 30a and the peripheral portion 30b that serve as electrodes disposed in parallel with the wafer W and the focus ring FR. The plasma control unit 102f controls the supply powers to the central portion 30a and the peripheral portion 30b based on the thickness $z_{FR}$ of the focus ring FR to allow the height difference between the interface of the plasma sheath formed above the wafer W and the interface of the plasma sheath formed above the focus ring FR to be within the predetermined range. Accordingly, the plasma processing apparatus 10 can suppress the differences in the etching characteristics of the wafers W.

Fifth Embodiment

Figure 16:
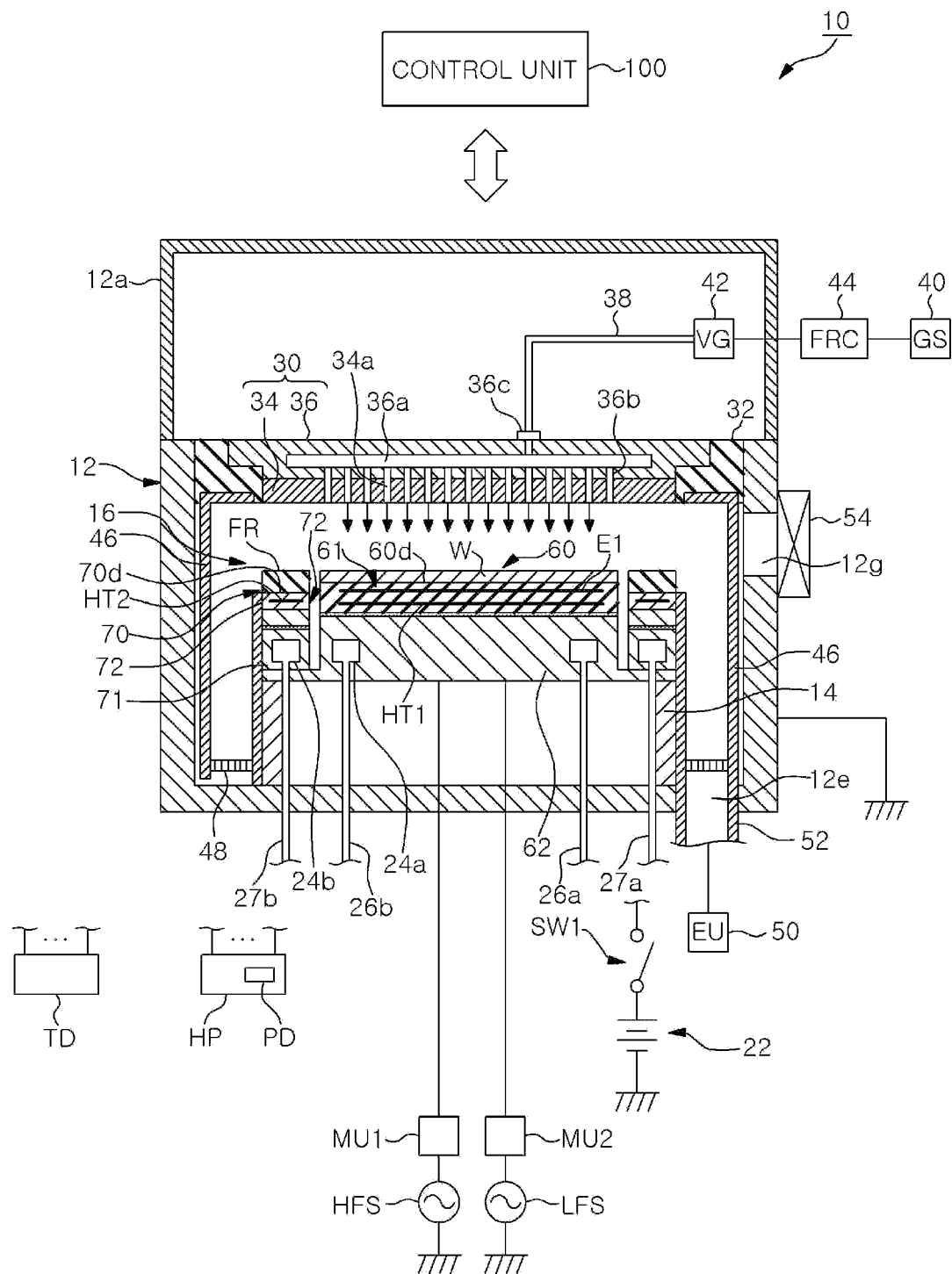
FIG. 16 is a cross-sectional view showing an example of a schematic configuration of a plasma processing apparatus according to a fifth embodiment.

Next, a fifth embodiment will be described. FIG. 16 is a cross-sectional view showing an example of a schematic configuration of a plasma processing apparatus according to a fifth embodiment. A configuration of the plasma processing apparatus 10 according to the fifth embodiment is basically the same as that of the plasma processing apparatus 10 according to the second embodiment shown in FIG. 9. Therefore, the difference therebetween is mainly described hereinafter, and like reference numerals will be given to like parts and redundant description thereof will be omitted. In the plasma processing apparatus 10 according to the fifth embodiment, the electromagnet 80 is not provided on the upper surface of the upper electrode 30, and the second mounting table 70 can be moved up and down.

(Configurations of First Mounting Table and Second Mounting Table)

Figure 17:
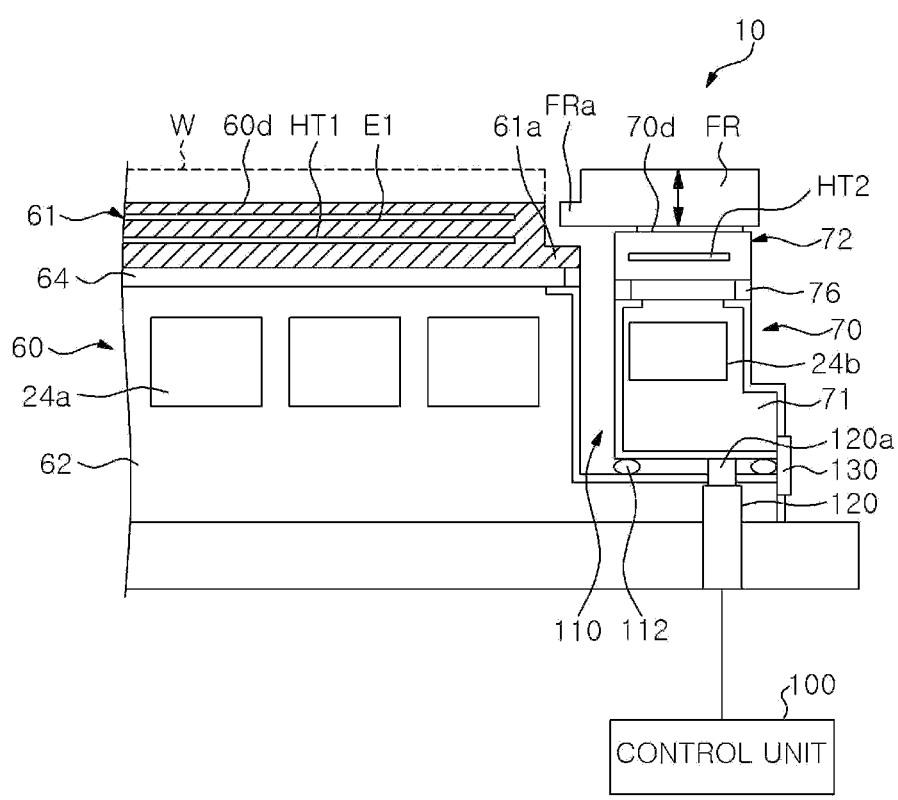
FIG. 17 is a schematic cross-sectional view showing configurations of the principal parts of a first mounting table and a second mounting table according to the fifth embodiment.

Configurations of principal parts of the first mounting table 2 and the second mounting table 7 according to the fifth embodiment will be described with reference to FIG. 17. FIG. 17 is a schematic cross-sectional view showing the configurations of the principal parts of the first mounting table and the second mounting table according to the fifth embodiment.

The first mounting table 60 includes the base 62 and the electrostatic chuck 61. The electrostatic chuck 61 is adhered to the base 62 through an insulating layer 64. The electrostatic chuck 61 is formed in a disc shape and provided coaxially with respect to the base 62. In the electrostatic chuck 61, the electrode μl is provided in an insulator. The upper surface of the electrostatic chuck 61 serves as the mounting surface 60d on which the wafer W is mounted. A flange portion 61a projecting outwardly in a radial direction of the electrostatic chuck 61 is formed at a lower end of the electrostatic chuck 61. In other words, the electrostatic chuck 61 has different outer diameters depending on positions of the side surface.

The electrostatic chuck 61 includes the heater HT1. The coolant channel 24a is formed in the base 62. The coolant channel 24a and the heater HT1 function as a temperature control mechanism for controlling the temperature of the wafer W. The heater HT1 may not be provided in the electrostatic chuck 61. For example, the heater HT1 may be adhered to the lower surface of the electrostatic chuck 61 or may be interposed between the mounting surface 60d and the coolant channel 24a.

The second mounting table 70 includes the base 71 and the focus ring heater unit 72. The base 71 is supported by the base 62. The focus ring heater unit 72 includes the heater HT2. A coolant channel 24b is formed in the base 71. The coolant channel 24b and the heater HT2 function as a temperature control mechanism for controlling the temperature of the focus ring FR. The focus ring heater unit 72 is adhered to the base 71 through an insulating layer 76. An upper surface of the focus ring heater unit 72 serves as the mounting surface 70d on which the focus ring FR is mounted. A sheet member having high thermal conductivity or the like may be provided on the upper surface of the focus ring heater unit 72.

The focus ring FR that is an annular member is coaxially provided with respect to the second mounting table 70. A protruding portion FRa is protruded in a radial direction from an inner side surface of the focus ring FR. In other words, the focus ring FR has different the inner diameters depending on positions of the inner side surface thereof. For example, an inner diameter of a portion of the focus ring FR where the protruding portion FRa is not formed is greater than an outer diameter of the wafer W and an outer diameter of the flange portion 61a of the electrostatic chuck 61. On the other hand, an inner diameter of a portion of the focus ring FR where the protruding portion FRa is formed is smaller than the outer diameter of the flange portion 61a of the electrostatic chuck 61 and greater than an outer diameter of a portion of the electrostatic chuck 61 where the flange portion 61a is not formed.

The focus ring FR is disposed on the second mounting table 70 in a state where the protruding portion FRa is separated from an upper surface of the flange portion 61a of the electrostatic chuck 61 and also separated from a side surface of the electrostatic chuck 61. In other words, a gap is formed between a lower surface of the protruding portion FRa of the focus ring FR and the upper surface of the flange portion 61a of the electrostatic chuck 61. Further, a gap is formed between a side surface of the protruding portion FRa of the focus ring FR and a side surface of the electrostatic chuck 61 where the flange portion 61a is not formed. The protruding portion FRa of the focus ring FR is located above a gap 110 between the base 62 of the first mounting table 60 and the base 71 of the second mounting table 70. In other words, when viewed from a direction perpendicular to the mounting surface 60d, the protruding portion FRa overlaps with the gap 110 and covers the gap 110. Accordingly, it is possible to suppress inflow of the plasma into the gap 110.

An elevating mechanism 120 for vertically moving the second mounting table 70 is provided at the first mounting table 60. For example, the elevating mechanism 120 is provided at the first mounting table 60 to be positioned below the second mounting table 70. The elevating mechanism 120 has therein an actuator and vertically moves the second mounting table 70 by extending and contracting a rod 120a by using driving force of the actuator. The elevating mechanism 120 may obtain driving force for expanding and contracting the rod 120a by converting the driving force of the motor by a gear or the like, or may obtain driving force for expanding and contracting the rod 120a by a hydraulic pressure or the like. Between the first mounting table 60 and the second mounting table 70, an O-ring 112 for interrupting vacuum is provided.

The second mounting table 70 is configured not to be affected even if it is raised. For example, the cooling channel 24b is configured as a flexible line or a mechanism capable of supplying a coolant even if the second mounting table 70 is vertically moved. The wiring for supplying power to the heater HT2 may be configured as a flexible wiring or a mechanism that is electrically connected even if the second mounting table 70 is vertically moved.

Further, the first mounting table 60 is provided with a conducting part 130 that is electrically connected to the second mounting table 70. The conducting part 130 is configured to electrically connect the first mounting table 60 and the second mounting table 70 even if the second mounting table 70 is vertically moved by the elevating mechanism 120. For example, the conducting part 130 is configured as a flexible wiring or a mechanism that is electrically connected by contact between a conductor and the base 71 even if the second mounting table 70 is vertically moved. The conducting part 130 is provided so that the second mounting table 70 and the first mounting table 60 have equal electrical characteristics. For example, a plurality of conducting parts 130 are provided on a circumferential surface of the first mounting table 60. The RF power supplied to the first mounting table 60 is also supplied to the second mounting table 70 through the conducting part 130. Alternatively, the conducting part 130 may be provided between the upper surface of the first mounting table 60 and the lower surface of the second mounting table 70.

The elevating mechanism 120 is arranged at multiple positions in a circumferential direction of the focus ring FR. In the plasma processing apparatus 10 according to the present embodiment, three elevating mechanisms 120 are provided. For example, the elevating mechanisms 120 are arranged on the side of the second mounting table 70 at a regular interval in a circumferential direction of the second mounting table 70. For example, the elevating mechanisms 120 are disposed at positions on the side of the second mounting table 70 at an interval of 120° in the circumferential direction of the second mounting table 70. Four or more elevating mechanisms 120 may be provided on the side of the second mounting table 70.

In the plasma processing apparatus 10, when the plasma processing is performed, the focus ring FR is consumed and the thickness $z_{FR}$ of the focus ring FR is reduced. When the thickness $z_{FR}$ of the focus ring FR becomes thin, a height different occurs between the plasma sheath above the focus ring FR and the plasma sheath above the wafer W, and thus the etching characteristics are changed.

Therefore, in the plasma processing apparatus 10 according to the fifth embodiment, the elevating mechanism 120 is controlled in response to the thickness $z_{FR}$ of the focus ring FR.

The plasma control unit 102f controls the elevating mechanism 120 based on the thickness $z_{FR}$ of the focus ring FR calculated by the parameter calculation unit 102c. For example, the plasma control unit 102f subtracts the thickness $z_{FR}$ of the current focus ring FR from the thickness of a new focus ring FR to obtain the consumed thickness. The plasma control unit 102f controls the elevating mechanism 120 to be moved up by the consumed thickness.

FIGS. 18A to 18C show an example of a sequence of raising the second mounting table. FIG. 18A shows a state where a new focus ring FR is mounted on the second mounting table 70. The height of the second mounting table 70 is adjusted so that the upper surface of the focus ring FR is located at a predetermined height when the new focus ring FR is mounted. For example, when the new focus ring FR is mounted on the second mounting table 70, the height of the second mounting table 70 is adjusted so that the etching uniformity of the wafer W is obtained. As the wafer W is etched, the focus ring FR is also consumed. FIG. 18B shows a state where the focus ring FR is consumed. In the example shown in FIG. 18B, the upper surface of the focus ring FR is consumed by 0.2 mm. In the plasma processing apparatus 10, the thickness $z_{FR}$ of the focus ring FR is calculated by the parameter calculation unit 102c, and the consumption amount of the focus ring FR is determined. Then, the plasma processing apparatus 10 controls elevating mechanism 120 to raise the second mounting base 70 in response to the consumption amount. FIG. 18C shows a state where the second mounting table 70 is raised. In the example shown in FIG. 18C, the upper surface of the focus ring FR is raised by 0.2 mm by raising the second mounting table 70.

As a result, in the plasma processing apparatus 10, the height difference $\Delta D_{wafer-FR}$ between the plasma sheath interface above the wafer W and the plasma sheath interface above the focus ring FR falls within a predetermined range. Accordingly, in the plasma processing apparatus 10, the change in the etching characteristics due to the consumption of the focus ring FR can be suppressed.

As described above, the plasma processing apparatus 10 according to the fifth embodiment includes the elevating mechanism 120 configured to vertically move the focus ring FR. The plasma control unit 102f controls the elevating mechanism 120 based on the thickness $z_{FR}$ of the focus ring FR 1 to allow the height difference between the interface of the plasma sheath formed above the wafer W and the interface of the plasma sheath formed above the focus ring FR to be within the predetermined range. Therefore, the plasma processing apparatus 10 can suppress the differences in the etching characteristics of the wafers W.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the scope of the accompanying claims and the spirit of the disclosures. The accompanying claims and their equivalents are intended to cover such forms or modifications as would fall within the scope and spirit of the disclosures.

For example, the above-described plasma processing apparatus 10 is a capacitively coupled plasma processing apparatus 10. However, it is possible to employ any plasma processing apparatus 10. For example, the plasma processing apparatus 10 may be any type of plasma processing apparatus such as an inductively coupled plasma processing apparatus 10 or a plasma processing apparatus 10 for exciting a gas by a surface wave such as microwave.

In the above-described embodiments, the case where the consumable part consumed by the plasma processing is the focus ring FR has been described as an example. However, the present disclosure is not limited thereto. Any consumable part may be used. For example, the wafer W is consumed by the plasma processing. Therefore, the wafer W may serve as the consumable part, and the plasma processing apparatus 10 may calculate the thickness of the wafer W. The aforementioned equations (1) to (13) may be applied to the calculation of the thickness of the wafer W by replacing the parameters regarding the focus ring FR such as the density, the heat capacity, and the thickness of the focus ring FR with the parameters regarding the wafer W. The mounting table 16 includes the heater HT1 configured to adjust the temperature of the mounting surface on which the wafer W is mounted. The heater control unit 102a controls a supply power supplied to the heater HT1 such that the heater HT1 reaches a setting temperature. While the heater control unit 102a controls the supply power to the heater HT1 such that the temperature of the heater HT1 becomes constant, the measurement unit 102b measures the supply power in the non-ignition state and the supply power in the transient state. The parameter calculation unit 102c calculates the thickness of the wafer W by performing fitting of the measurement results by using the equations (1) to (11) as a calculation model. Accordingly, the plasma processing apparatus 10 can obtain the thickness of the wafer W.

In the above-described embodiments, as shown in FIG. 2, the case where the mounting region 18a of the electrostatic chuck 18 is divided into two division regions 75 in the radial direction has been described as an example. However, the present disclosure is not limited thereto. For example, the mounting region 18a may be divided in the circumferential direction. For example, the division region 75b on which the focus ring FR is disposed may be divided in the circumferential direction.

Figure 19:
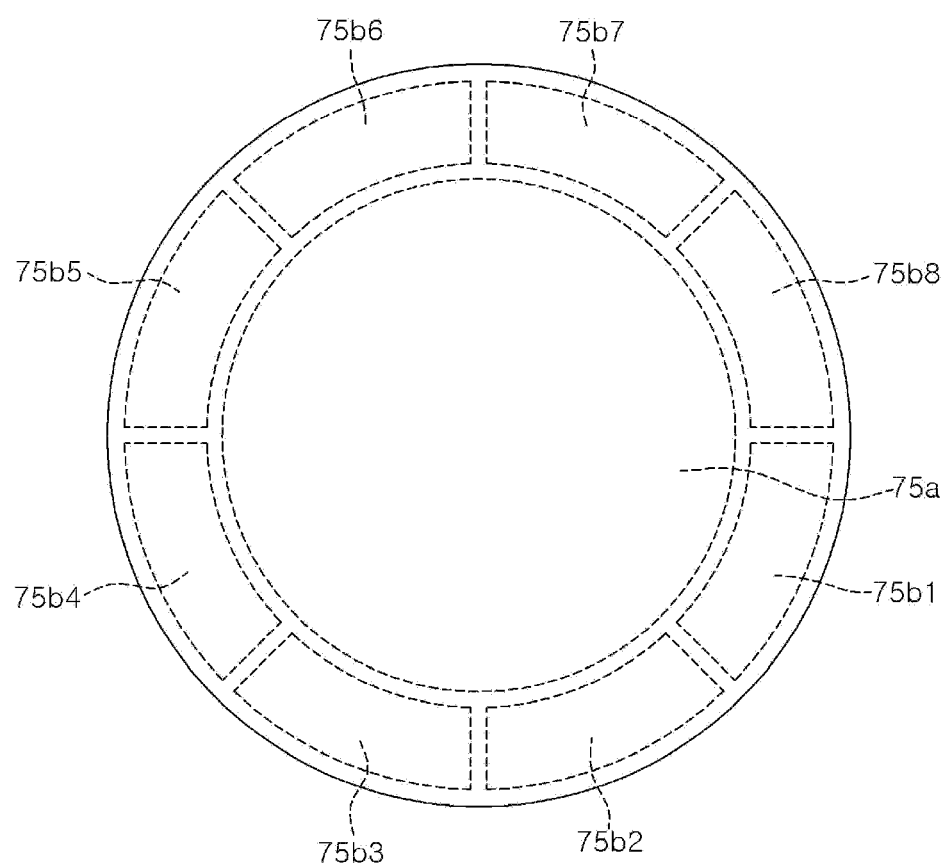
FIG. 19 is a plan view showing a mounting table according to another embodiment.

FIG. 19 is a plan view showing a mounting table according to another embodiment. In FIG. 19, the division region 75b is divided into eight division regions 75b1 to 75b8 in the circumferential direction. The focusing ring FR is disposed on the division regions 75b1 to 75b8. The heater HT2 is provided in each of the division regions 75b1 to 75b8. The heater control unit 102a controls the supply power to each heater HT2 so that the heater HT2 provided in each of the division regions 75b1 to 75b8 reaches a setting temperature set for each division region. While the heater control unit 102a controls the supply power to each heater HT2 such that the temperature of the heater HT2 becomes constant, the measurement unit 102b measures the supply power in the non-ignition state and the supply power in the transient state for each heater HT2.

For each heater HT2, the parameter calculation unit 102c calculates the thickness $z_{FR}$ of the focus ring FR by performing fitting with the calculation model by using the supply power in the non-ignition state and the supply power in the transient state measured by the measurement unit 102b. Accordingly, the plasma processing apparatus 10 can obtain the thickness $z_{FR}$ of the focus ring FR for each of the division regions 75b1 to 75b8.

In the above-described embodiments, the case where the plasma state is changed by performing one of the change of the magnetic force of the electromagnet 80, the change of the power supplied to the electrode 73, the change of the powers supplied to the central portion 30a and the peripheral portion 30b, and the raising and lowering of the focus ring FR has been described as an example. However, the present disclosure is not limited thereto. The plasma state may be changed by changing an impedance. For example, the impedance of the second mounting table 70 may be changed. The plasma control unit 102f controls the impedance of the second mounting table 70 based on the thickness $z_{FR}$ of the focus ring such that the height difference $\Delta D_{wafer-FR}$ between the plasma sheath interface above the wafer W and the plasma sheath interface above the focus ring FR falls within a predetermined range. For example, a ring-shaped space is formed in the vertical direction inside the second mounting table 70, and a ring-shaped conductor is provided in the space so as to be moved up and down by a conductor driving mechanism. The conductor is made of a conductive material such as aluminum. Therefore, the impedance of the second mounting table 70 can be changed by vertically moving the conductor by the conductor driving mechanism.

Further, the second mounting table 70 may have any configuration as long as the impedance can be changed.

The correction information 104a stores an impedance correction value for each thickness of the focus ring FR. For example, a height of the conductor that allows the height difference $\Delta D_{wafer\text{-}FR}$ between the plasma sheath interface above the wafer W and the plasma sheath interface above the focus ring FR to be within a predetermined range is experimentally measured. In the correction information 104a, for each thickness of the wafer W, a correction value of the height of the conductor that allows the height difference $\Delta D_{wafer\text{-}FR}$ to be within the predetermined range is stored based on the measurement result. The plasma control unit 102f reads, from the correction information 104a, a correction value for the height of the conductor that corresponds to the thickness $z_{FR}$ of the focus ring FR calculated by the parameter calculation unit 102c. Then, the plasma control unit 102f controls the conductor driving mechanism so that the height of the conductor becomes a height corresponding to the read correction value at the time of the plasma processing. Thus, in the plasma processing apparatus 10, the height difference $\Delta D_{wafer\text{-}FR}$ between the plasma sheath interface above the wafer W and the plasma sheath interface above the focus ring FR is within a predetermined range, and the differences in the etching characteristics of the wafers W can be suppressed.

In the fourth embodiment described above, the case where the DC voltage is applied from the power supply 74 to the electrode 73 has been described as an example. However, the present disclosure is not limited thereto. For example, the power supply 74 may be an AC power supply. The plasma control unit 102f may control one of the frequency, the voltage, and the power of AC power supplied from the power supply 74 to the electrode 73 based on the thickness $z_{FR}$ of the focus ring FR such that the height difference $\Delta D_{wafer\text{-}FR}$ between the plasma sheath interface above the wafer W and the plasma sheath interface above the focus ring FR falls within a predetermined range.

Moreover, the above-described embodiments may be combined to be implemented. For example, the second embodiment and the third embodiment may be combined to control the magnetic force of the electromagnet 80 and the DC voltage applied to the electrode 73 such that the height difference between the plasma sheath interface above the wafer W and the plasma sheath interface above the focus ring FR falls within a predetermined range.

In the sixth embodiment described above, the case where the elevating mechanism 120 is used to raise and lower the focus ring FR by vertically moving the second mounting table 70 has been described as an example. However, the present disclosure is not limited thereto. For example, a pin or the like is vertically moved and extend through the second mounting table 70 to raise and lower the focus ring FR only.

In each of the above-described embodiments, the problem caused by the consumption of the focus ring has been described as an example. However, the present disclosure is not limited thereto. Since the same problem occurs in all consumable parts consumed by the plasma processing, for example, if a temperature of a protective cover made of an insulator disposed to surround the outer peripheral portion of the focus ring is also adjusted with a heater and the like, the degree of consumption can be obtained in the same manner described above. Further, the thickness of the wafer W mounted on the mounting table can be calculated by in the same manner described above.

The invention claimed is:

1. A plasma processing apparatus comprising:
a mounting table including a heater configured to adjust a temperature of a mounting surface of the mounting table on which a consumable part is mounted; and
a process controller comprising:
a heater controller configured to control a supply power to the heater such that the heater reaches a setting temperature,
a measurement element configured to measure, while the supply power to the heater is controlled by the heater controller such that the temperature of the heater becomes constant, the supply power in a non-ignition state in which plasma is not ignited and the supply power in an ignition state after the plasma is ignited, and
a parameter calculator configured to calculate a thickness of the consumable part by using a heat input amount from plasma to the consumable part, a thermal resistance between the consumable part and the mounting surface, the thickness of the consumable part as parameters, and using the measured supply power in the non-ignition state and the measured supply power in the ignition state.

2. The plasma processing apparatus of claim 1, wherein, the mounting surface of the mounting table includes division regions, and the heater is disposed in each of the division regions,
wherein the heater controller controls the supply power to the heater such that the heater disposed in each of the division regions reaches a setting temperature for each of the division regions,
wherein the measurement element measures the supply power in the non-ignition state and the supply power in the ignition state for the heater disposed in each of the division regions while the supply power to the heater disposed in each of the division regions is controlled by the heater controller such that the temperature of the heater is constant, and
wherein the parameter calculator calculates the thickness of the consumable part for the heater disposed in each of the division regions by using the supply power in the non-ignition state and the supply power in the ignition state for the heater disposed in each of the division regions.

3. The plasma processing apparatus of claim 1, wherein the measurement element measures the supply power in the non-ignition state and the supply power in the ignition state in a predetermined cycle,
wherein the parameter calculator calculates the thickness of the consumable part in each iteration of the predetermined cycle by using the measured supply power in the non-ignition state and the measured supply power in the ignition state, and
wherein the process controller further comprises an alarm element configured to issue an alarm based on a change in the thickness of the consumable part calculated by the parameter calculator.

4. The plasma processing apparatus of claim 2, wherein the measurement element measures the supply power in the non-ignition state and the supply power in a transient state in a predetermined cycle,
wherein the parameter calculator calculates the thickness of the consumable part in each iteration of the predetermined cycle by using the measured supply power in the non-ignition state and the measured supply power in the transient state, and wherein the process controller further comprises an alarm element configured to issue an alarm based on a change in the thickness of the consumable part calculated by the parameter calculator.

5. The plasma processing apparatus of claim 1, wherein the consumable part is a focus ring, and the focus ring is disposed on the mounting table to surround a target object for the plasma processing, and
wherein the process controller further comprises a plasma controller configured to control the plasma processing based on the thickness of the focus ring calculated by the parameter calculator such that a height difference between an interface of a plasma sheath formed above the target object and an interface of a plasma sheath formed above the focus ring is within a predetermined range.

6. The plasma processing apparatus of claim 5, further comprising:
at least one electromagnet arranged in parallel with at least one of the target object or the focus ring,
wherein the plasma controller controls a supply power to the electromagnet based on the thickness of the focus ring such that a magnetic force of the electromagnet is controlled to allow the height difference between the interface of the plasma sheath formed above the target object and the interface of the plasma sheath formed above the focus ring to be within the predetermined range.

7. The plasma processing apparatus of claim 5, further comprising:
an electrode provided at the mounting surface on which the focus ring is mounted and to which a DC voltage is applied,
wherein the plasma controller controls the DC voltage applied to the electrode based on the thickness of the focus ring to allow the height difference between the interface of the plasma sheath formed above the target object and the interface of the plasma sheath formed above the focus ring to be within the predetermined range.

8. The plasma processing apparatus of claim 5, further comprising:
an electrode provided at a mounting surface on which the focus ring is mounted and to which an AC voltage is applied,
wherein the plasma controller controls the AC voltage applied to the electrode based on the thickness of the focus ring to allow the height difference between the interface of the plasma sheath formed above the target object and the interface of the plasma sheath formed above the focus ring to be within the predetermined range.

9. The plasma processing apparatus of claim 5, wherein an impedance of the mounting table on which the focus ring is mounted is changeable, and
wherein the plasma controller controls the impedance of the mounting table based on the thickness of the focus ring to allow the height difference between the interface of the plasma sheath formed above the target object and the interface of the plasma sheath formed above the focus ring to be within the predetermined range.

10. The plasma processing apparatus of claim 5, further comprising:
a gas supply unit disposed to face the target object and the focus ring to inject a processing gas and having an upper electrode that is provided in parallel with at least one of the target object and the focus ring,
wherein the plasma controller controls a supply power to the electrode based on the thickness of the focus ring to allow the height difference between the interface of the plasma sheath formed above the target object and the interface of the plasma sheath formed above the focus ring to be within the predetermined range.

11. The plasma processing apparatus of claim 5, further comprising:
an elevating mechanism configured to vertically move the focus ring,
wherein the plasma controller controls the elevating mechanism based on the thickness of the focus ring to allow the height difference between the interface of the plasma sheath formed above the target object and the interface of the plasma sheath formed above the focus ring to be within the predetermined range.

12. The plasma processing apparatus of claim 1, wherein the heat input amount from plasma to the consumable part is calculated based on a heat generation from a heater in the non-ignition state and a heat generation from a heater in a steady state of the ignition state.

13. The plasma processing apparatus of claim 1, wherein the heat input amount from plasma to the consumable part is calculated based on a heat generation from a heater in the non-ignition state and a heat generation from a heater during a transient state in which the supply power to the heater is decreased in the ignition state.

14. The plasma processing apparatus of claim 1, wherein the heat input amount from plasma to the consumable part and the thermal resistance between the consumable part and the mounting surface are calculated using values obtained by using a new focus ring.

15. The plasma processing apparatus of claim 2, wherein a temperature sensor configured to detect a temperature of the heater is provided in each of the division regions.

16. The plasma processing apparatus of claim 2, wherein the mounting surface of the mounting table is divided into multiple regions in a circumferential direction.

17. The plasma processing apparatus of claim 1, further comprising:
a setting temperature calculation unit configured to calculate a setting temperature of the heater at which a focus ring reaches a target temperature, by using the heat input amount, the thermal resistance, and the thickness of the focus ring calculated by the parameter calculator.

18. The plasma processing apparatus of claim 1, wherein the consumable part is an insulating member arranged at an outer periphery of a focus ring.

19. A storage medium storing a calculation program that performs a process of controlling a supply power to a heater of a mounting table including the heater configured to adjust a temperature of a mounting surface on which a consumable part that is consumed by plasma processing is mounted such that the heater reaches a setting temperature, measuring the supply power in a non-ignition state in which plasma is not ignited and the supply power in an ignition state after the plasma is ignited, and calculating a thickness of the consumable part by using a heat input amount from plasma to the consumable part, a thermal resistance between the consumable part and the mounting surface, the thickness of the consumable part as parameters, and by using the measured supply power in the non-ignition state and the measured supply power in the ignition state.

* * * * *